US008877002B2

(12) United States Patent
Mitsuhashi et al.

(10) Patent No.: US 8,877,002 B2
(45) Date of Patent: Nov. 4, 2014

(54) INTERNAL MEMBER OF A PLASMA PROCESSING VESSEL

(71) Applicant: Tokyo Electron Limited, Tokyo (JP)

(72) Inventors: Kouji Mitsuhashi, Yamanashi (JP); Hiroyuki Nakayama, Yamanashi (JP); Nobuyuki Nagayama, Yamanashi (JP); Tsuyoshi Moriya, Yamanashi (JP); Hiroshi Nagaike, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/901,673

(22) Filed: May 24, 2013

(65) Prior Publication Data

US 2013/0255881 A1    Oct. 3, 2013

Related U.S. Application Data

(62) Division of application No. 12/838,096, filed on Jul. 16, 2010, now Pat. No. 8,449,715, which is a division of application No. 10/722,602, filed on Nov. 28, 2003, now Pat. No. 7,780,786.

(30) Foreign Application Priority Data

Nov. 28, 2002  (JP) .................................. 2002-345855

(51) Int. Cl.
*C23C 16/00*      (2006.01)
*C23F 1/00*       (2006.01)
*H01L 21/306*     (2006.01)
*H05H 1/24*       (2006.01)
*C23C 16/44*      (2006.01)
*H01J 37/32*      (2006.01)

(52) U.S. Cl.
CPC .............. *H05H 1/24* (2013.01); *C23C 16/4404* (2013.01); *H01J 37/32477* (2013.01)
USPC .................. 156/345.34; 118/715; 156/345.43; 156/345.44; 156/345.45; 156/345.47

(58) Field of Classification Search
USPC ............ 156/345.34, 345.43–345.47; 118/715
See application file for complete search history.

(56) References Cited

U.S. PATENT DOCUMENTS

| 4,310,390 A | 1/1982 | Bradley et al. |
| 4,357,387 A | 11/1982 | George et al. |

(Continued)

FOREIGN PATENT DOCUMENTS

| DE | 94 21 671 | 7/1996 |
| EP | 0326318 | 8/1989 |

(Continued)

OTHER PUBLICATIONS

Production drawing for Deposition Shield, Upper believed to be sold in the U.S. on Apr. 12, 2000.

(Continued)

*Primary Examiner* — Rakesh Dhingra
(74) *Attorney, Agent, or Firm* — Rothwell, Figg, Ernst & Manbeck, P.C.

(57) ABSTRACT

An internal member of a plasma processing vessel includes a base material and a film formed by thermal spraying of ceramic on a surface of the base material. The film is formed of ceramic which includes at least one kind of element selected from the group consisting of B, Mg, Al, Si, Ca, Cr, Y, Zr, Ta, Ce and Nd. In addition, at least a portion of the film is sealed by a resin.

13 Claims, 15 Drawing Sheets

(56) References Cited

U.S. PATENT DOCUMENTS

| | | |
|---|---|---|
| 4,469,619 A | 9/1984 | Ohno et al. |
| 4,485,151 A | 11/1984 | Stecura |
| 4,593,007 A | 6/1986 | Novinski |
| 4,842,683 A | 6/1989 | Cheng et al. |
| 4,877,757 A | 10/1989 | York et al. |
| 5,000,113 A | 3/1991 | Wang et al. |
| 5,074,456 A | 12/1991 | Degner et al. |
| 5,126,102 A | 6/1992 | Takahashi et al. |
| 5,180,467 A | 1/1993 | Cook et al. |
| 5,334,462 A | 8/1994 | Vine et al. |
| 5,362,335 A | 11/1994 | Rungta |
| 5,366,585 A | 11/1994 | Robertson et al. |
| 5,423,936 A | 6/1995 | Tomita et al. |
| 5,426,310 A | 6/1995 | Tamada et al. |
| 5,484,752 A | 1/1996 | Waku et al. |
| 5,489,449 A | 2/1996 | Umeya et al. |
| 5,494,713 A | 2/1996 | Ootuki |
| 5,521,790 A | 5/1996 | Ruckel et al. |
| 5,534,356 A | 7/1996 | Mahulikar et al. |
| 5,551,190 A | 9/1996 | Yamagishi et al. |
| 5,556,501 A | 9/1996 | Collins et al. |
| 5,614,055 A | 3/1997 | Fairbairn et al. |
| 5,637,237 A | 6/1997 | Oehrlein et al. |
| 5,641,375 A | 6/1997 | Nitescu et al. |
| 5,680,013 A | 10/1997 | Dornfest et al. |
| 5,725,960 A | 3/1998 | Konishi et al. |
| 5,759,360 A | 6/1998 | Ngan et al. |
| 5,798,016 A | 8/1998 | Oehrlein et al. |
| 5,820,723 A | 10/1998 | Benjamin et al. |
| 5,834,070 A | 11/1998 | Movchan et al. |
| 5,851,343 A | 12/1998 | Hsu et al. |
| 5,868,848 A | 2/1999 | Tsukamoto |
| 5,879,575 A | 3/1999 | Tepman et al. |
| 5,882,411 A | 3/1999 | Zhao et al. |
| 5,885,356 A | 3/1999 | Zhao et al. |
| 5,885,402 A | 3/1999 | Esquibel |
| 5,891,253 A | 4/1999 | Wong et al. |
| 5,891,350 A | 4/1999 | Shan et al. |
| 5,892,278 A | 4/1999 | Horita |
| 5,894,887 A | 4/1999 | Kelsey et al. |
| 5,895,586 A | 4/1999 | Kaji et al. |
| 5,900,064 A | 5/1999 | Kholodenko |
| 5,902,763 A | 5/1999 | Waku et al. |
| 5,904,778 A | 5/1999 | Lu et al. |
| 5,911,852 A | 6/1999 | Katayama et al. |
| 5,919,332 A | 7/1999 | Koshiishi et al. |
| 5,925,228 A | 7/1999 | Panitz |
| 5,944,902 A | 8/1999 | Redeker et al. |
| 5,948,521 A | 9/1999 | Dlugosch et al. |
| 5,952,054 A | 9/1999 | Sato et al. |
| 5,952,060 A | 9/1999 | Ravi |
| 5,955,182 A | 9/1999 | Yasuda et al. |
| 5,968,377 A | 10/1999 | Yuasa et al. |
| 5,985,102 A | 11/1999 | Leiphart |
| 5,994,662 A | 11/1999 | Murugesh |
| 6,068,729 A | 5/2000 | Shrotriya |
| 6,073,449 A | 6/2000 | Watanabe et al. |
| 6,079,356 A | 6/2000 | Umotoy et al. |
| 6,096,161 A | 8/2000 | Kim et al. |
| 6,106,625 A | 8/2000 | Koai et al. |
| 6,108,189 A | 8/2000 | Weldon et al. |
| 6,110,287 A | 8/2000 | Arai et al. |
| 6,120,640 A | 9/2000 | Shih et al. |
| 6,120,955 A | 9/2000 | Tokutake et al. |
| 6,123,791 A | 9/2000 | Han et al. |
| 6,123,804 A | 9/2000 | Babassi et al. |
| 6,129,808 A | 10/2000 | Wicker et al. |
| 6,139,983 A | 10/2000 | Ohashi et al. |
| 6,143,646 A | 11/2000 | Wetzel |
| 6,170,429 B1 | 1/2001 | Schoepp et al. |
| 6,176,969 B1 | 1/2001 | Park et al. |
| 6,182,603 B1 | 2/2001 | Shang et al. |
| 6,210,486 B1 | 4/2001 | Mizukami et al. |
| 6,221,202 B1 | 4/2001 | Walko, II |
| 6,246,479 B1 | 6/2001 | Jung et al. |
| 6,264,788 B1 | 7/2001 | Tomoyasu et al. |
| 6,265,757 B1 | 7/2001 | Brady et al. |
| 6,266,133 B1 | 7/2001 | Miyajima et al. |
| 6,294,261 B1 | 9/2001 | Sangeeta et al. |
| 6,296,716 B1 | 10/2001 | Haerle et al. |
| 6,296,740 B1 | 10/2001 | Xie et al. |
| 6,335,293 B1 | 1/2002 | Luo et al. |
| 6,364,949 B1 | 4/2002 | Or et al. |
| 6,368,987 B1 | 4/2002 | Kopacz et al. |
| 6,373,573 B1 | 4/2002 | Jung et al. |
| 6,383,333 B1 | 5/2002 | Haino et al. |
| 6,383,964 B1 | 5/2002 | Nakahara et al. |
| 6,387,817 B1 | 5/2002 | Buckfeller |
| 6,394,026 B1 | 5/2002 | Wicker et al. |
| 6,444,083 B1 | 9/2002 | Steger et al. |
| 6,514,377 B1 | 2/2003 | Morimoto |
| 6,519,037 B2 | 2/2003 | Jung et al. |
| 6,527,911 B1 | 3/2003 | Yen et al. |
| 6,533,910 B2 | 3/2003 | O'Donnell et al. |
| 6,537,429 B2 | 3/2003 | O'Donnell et al. |
| 6,544,380 B2 | 4/2003 | Tomoyasu et al. |
| 6,554,906 B1 | 4/2003 | Kuibira et al. |
| 6,562,186 B1 | 5/2003 | Saito et al. |
| 6,570,654 B2 | 5/2003 | Jung et al. |
| 6,583,064 B2 | 6/2003 | Wicker et al. |
| 6,590,660 B2 | 7/2003 | Jung et al. |
| 6,613,204 B2 | 9/2003 | Xie et al. |
| 6,613,442 B2 | 9/2003 | O'Donnell et al. |
| 6,632,549 B1 | 10/2003 | Ohashi et al. |
| 6,641,697 B2 | 11/2003 | Han et al. |
| 6,663,714 B2 | 12/2003 | Mizuno et al. |
| 6,695,929 B2 | 2/2004 | Kanekiyo et al. |
| 6,724,140 B2 | 4/2004 | Araki |
| 6,726,801 B2 | 4/2004 | Ahn |
| 6,733,620 B1 | 5/2004 | Sugiyama et al. |
| 6,738,862 B1 | 5/2004 | Ross et al. |
| 6,771,483 B2 | 8/2004 | Harada et al. |
| 6,776,873 B1 | 8/2004 | Sun et al. |
| 6,783,863 B2 | 8/2004 | Harada et al. |
| 6,783,875 B2 | 8/2004 | Yamada et al. |
| 6,798,519 B2 | 9/2004 | Nishimoto et al. |
| 6,805,952 B2 | 10/2004 | Chang et al. |
| 6,806,949 B2 | 10/2004 | Ludviksson et al. |
| 6,811,651 B2 | 11/2004 | Long |
| 6,830,622 B2 | 12/2004 | O'Donnell et al. |
| 6,833,279 B2 | 12/2004 | Choi |
| 6,837,966 B2 | 1/2005 | Nishimoto et al. |
| 6,852,433 B2 | 2/2005 | Maeda |
| 6,875,477 B2 | 4/2005 | Trickett et al. |
| 6,884,516 B2 | 4/2005 | Harada et al. |
| 6,894,769 B2 | 5/2005 | Ludviksson et al. |
| 7,147,749 B2 | 12/2006 | Nishimoto et al. |
| 7,163,585 B2 | 1/2007 | Nishimoto et al. |
| 7,300,537 B2 | 11/2007 | O'Donnell et al. |
| 7,311,797 B2 | 12/2007 | O'Donnell et al. |
| 2001/0003271 A1 | 6/2001 | Otsuki |
| 2001/0050144 A1 | 12/2001 | Nishikawa et al. |
| 2002/0066532 A1 | 6/2002 | Shih et al. |
| 2002/0076508 A1 | 6/2002 | Chiang et al. |
| 2002/0086118 A1 | 7/2002 | Chang et al. |
| 2002/0086501 A1 | 7/2002 | O'Donnell et al. |
| 2002/0086545 A1 | 7/2002 | O'Donnell et al. |
| 2002/0086553 A1 | 7/2002 | O'Donnell et al. |
| 2002/0090464 A1 | 7/2002 | Jiang et al. |
| 2002/0142611 A1 | 10/2002 | O'Donnell et al. |
| 2002/0177001 A1 | 11/2002 | Harada et al. |
| 2003/0010446 A1 | 1/2003 | Kajiyama et al. |
| 2003/0029563 A1 | 2/2003 | Kaushal et al. |
| 2003/0082412 A1 | 5/2003 | Fukuda et al. |
| 2003/0084848 A1 | 5/2003 | Long |
| 2003/0113479 A1 | 6/2003 | Fukuda et al. |
| 2003/0200929 A1 | 10/2003 | Otsuki |
| 2004/0026372 A1 | 2/2004 | Takenaka et al. |
| 2004/0035364 A1 | 2/2004 | Tomoyoshi et al. |
| 2004/0050495 A1 | 3/2004 | Sumiya et al. |
| 2004/0060516 A1 | 4/2004 | Nishimoto et al. |
| 2004/0060656 A1 | 4/2004 | Saigusa et al. |
| 2004/0060657 A1 | 4/2004 | Saigusa et al. |
| 2004/0060658 A1 | 4/2004 | Nishimoto et al. |

(56) References Cited

U.S. PATENT DOCUMENTS

| | | |
|---|---|---|
| 2004/0060661 A1 | 4/2004 | Nishimoto et al. |
| 2004/0061447 A1 | 4/2004 | Saigusa et al. |
| 2004/0063333 A1 | 4/2004 | Saigusa et al. |
| 2004/0072426 A1 | 4/2004 | Jung |
| 2004/0081746 A1 | 4/2004 | Imafuku |
| 2004/0083970 A1 | 5/2004 | Imafuku et al. |
| 2004/0125359 A1 | 7/2004 | Ludviksson et al. |
| 2004/0168640 A1 | 9/2004 | Muto et al. |
| 2004/0173155 A1 | 9/2004 | Nishimoto et al. |
| 2004/0216667 A1 | 11/2004 | Mitsuhashi et al. |
| 2005/0103268 A1 | 5/2005 | Nishimoto et al. |
| 2005/0103275 A1 | 5/2005 | Sasaki et al. |
| 2005/0150866 A1 | 7/2005 | O'Donnell |

FOREIGN PATENT DOCUMENTS

| | | |
|---|---|---|
| EP | 0 508 731 | 10/1992 |
| EP | 0 573 057 | 12/1993 |
| EP | 0 814 495 | 6/1997 |
| EP | 0 799 904 | 10/1997 |
| EP | 0 841 838 | 5/1998 |
| EP | 1 069 603 | 1/2001 |
| EP | 1 081 749 | 7/2001 |
| EP | 1 156 130 | 11/2001 |
| GB | 2 252 567 | 8/1992 |
| JP | 59-186325 | 10/1984 |
| JP | 61-207566 | 9/1986 |
| JP | 62-067161 | 3/1987 |
| JP | 63-000450 | 1/1988 |
| JP | 64-039728 | 2/1989 |
| JP | 1-120328 | 8/1989 |
| JP | 1-312087 | 12/1989 |
| JP | 02-054780 | 2/1990 |
| JP | 02-267967 | 11/1990 |
| JP | 03-115535 | 5/1991 |
| JP | 4-238882 | 8/1992 |
| JP | 05-070922 | 3/1993 |
| JP | 05-117064 | 5/1993 |
| JP | 05-121360 | 5/1993 |
| JP | 05-198532 | 8/1993 |
| JP | 05-238855 | 9/1993 |
| JP | 05-238859 | 9/1993 |
| JP | 06-011346 | 2/1994 |
| JP | 06-057396 | 3/1994 |
| JP | 06-136505 | 5/1994 |
| JP | 06-142822 | 5/1994 |
| JP | 06-256926 | 9/1994 |
| JP | 06-287739 | 10/1994 |
| JP | 07-058013 A | 3/1995 |
| JP | 07-126827 | 5/1995 |
| JP | 07-176524 | 7/1995 |
| JP | 07-226378 | 8/1995 |
| JP | 07-245295 | 9/1995 |
| JP | 08-037180 | 2/1996 |
| JP | 08-041309 | 2/1996 |
| JP | 08-081777 | 3/1996 |
| JP | 08-268751 | 10/1996 |
| JP | 08-339895 | 12/1996 |
| JP | 09-069554 | 3/1997 |
| JP | 9-75832 | 3/1997 |
| JP | 09-228070 | 9/1997 |
| JP | 09-272987 | 10/1997 |
| JP | 9-298190 | 11/1997 |
| JP | 10-004083 | 1/1998 |
| JP | 10-045461 | 2/1998 |
| JP | 10-045467 | 2/1998 |
| JP | 10-130884 | 5/1998 |
| JP | 10-214819 | 8/1998 |
| JP | 10-226869 | 8/1998 |
| JP | 10-251871 | 9/1998 |
| JP | 10-277707 | 10/1998 |
| JP | 11-001757 | 1/1999 |
| JP | 11-080925 | 3/1999 |
| JP | 11-207161 | 8/1999 |
| JP | 11-233292 | 8/1999 |
| JP | 11-310451 | 11/1999 |
| JP | 11-312646 | 11/1999 |
| JP | 2000-119840 A | 4/2000 |
| JP | 2000-124197 | 4/2000 |
| JP | 2000-164570 | 6/2000 |
| JP | 2000-303180 | 10/2000 |
| JP | 2001-031484 | 2/2001 |
| JP | 2001-152307 | 6/2001 |
| JP | 2001-164354 | 6/2001 |
| JP | 2001-203258 | 7/2001 |
| JP | 2001-226773 | 8/2001 |
| JP | 2002-88462 | 3/2002 |
| JP | 2002-134481 | 5/2002 |
| JP | 2002-151473 | 5/2002 |
| JP | 2002-228803 | 8/2002 |
| KR | 1991-002451 | 6/1988 |
| KR | 1999-0008937 | 9/1994 |
| KR | 1999-008142 | 1/1999 |
| KR | 1999-13565 | 2/1999 |
| KR | 10-2004-0007601 | 1/2004 |
| WO | 99/50886 | 10/1999 |
| WO | WO 02/079538 | 10/2000 |
| WO | 01/42526 | 6/2001 |
| WO | 02/39495 | 5/2002 |
| WO | 02/48421 | 6/2002 |
| WO | 2004/030011 | 4/2004 |
| WO | 2004/030012 | 4/2004 |
| WO | 2004/030013 | 4/2004 |
| WO | 2004/030014 | 4/2004 |
| WO | 2004/030015 | 4/2004 |
| WO | 2004/030020 | 4/2004 |
| WO | 2004/030426 | 4/2004 |
| WO | 2004/095530 | 11/2004 |
| WO | 2004/095532 | 11/2004 |

OTHER PUBLICATIONS

Production drawing for Deposition Shield believed to be sold in the U.S. prior to Sep. 30, 2001.

Production drawing for Upper Electrode believed to be sold in the U.S. prior to Sep. 30, 2001.

JIS Using Series, "Spraying Techniques Manual.", p. 95 (Oct. 30, 1998, Japanese Standard Association), with English Translation.

Yousha Gitjutsu Handbook, $1^{st}$ Edition, Japan Thermal Spraying Society, Techno Consultants, Inc., pp. 3, 316-317 (1998) (with partial English translation).

INTERNAL MEMBER OF A PLASMA PROCESSING VESSEL

CROSS-REFERENCE TO RELATED APPLICATIONS

This application claims the benefit of priority of each of the following applications and describes the relationship of the earlier applications. The present application is a Divisional Application of and claims the benefit of priority from co-pending U.S. application Ser. No. 12/838,096, filed Jul. 16, 2010, and also claims the benefit of priority from U.S. application Ser. No. 10/722,602, filed Nov. 28, 2003, now U.S. Pat. No. 7,780,786, issued Aug. 24, 2010. The present application is further based upon and claims the benefit of priority from the prior Japanese Patent Application No. 2002-345855, filed Nov. 28, 2002. The entire contents of foregoing applications are incorporated herein by reference.

BACKGROUND OF THE INVENTION

1. Field of the Invention

The present invention relates to an internal member of a plasma processing vessel; and, more particularly, to an internal member of a plasma processing vessel, for example, a deposition shield, an exhaust plate, a focus ring, an electrode plate, an electrostatic chuck, an inner wall member of a processing vessel and the like, for use in a plasma processing vessel in which a plasma atmosphere of a processing gas including a halogen element is formed.

2. Description of the Related Art

Processes of manufacturing a semiconductor, a liquid crystal device and the like generally employ a plasma process using a plasma, wherein an internal member of a processing vessel tends to be considerably corroded and worn out because a gas including a halogen element, e.g., a fluoride such as $C_4F_8$ or $NF_3$, a chloride such as $BCl_3$ or $SnCl_4$, and a bromide such as HBr, is used in the processing vessel. Therefore, strong plasma resistance is needed in internal members of the plasma processing vessel, such as a deposition shield, an exhaust plate, a focus ring, an electrode plate, an electrostatic chuck, an inner wall of the processing vessel and the like.

In conjunction with this, there is disclosed a technique for improving plasma resistivity of the internal member of the processing vessel by forming a thermally sprayed film with a highly corrosion resistant material such as $Al_2O_3$ or $Y_2O_3$ on a surface of a base material made of Al, Al alloy, Al oxide, quartz or the like (see, e.g., reference patent 1). Further, an anodic oxidized film may be formed between the base material and the thermally sprayed film. Furthermore, in order to improve adhesivity of the thermally sprayed film, the surface of the base material or the anodic oxidized film can be roughened intentionally by using blast processing or the like to prevent the thermally sprayed film from being peeled off by anchor effect.

In case of the above-mentioned plasma etching processing apparatus, cleaning by a cleaning fluid of pure water, fluorine-based solvent or organic solvent such as acetone is performed on a regular basis to remove a reaction by-product attached to inside of the processing vessel in addition to using the processing gas including a highly corrosive halogen element. In this case, the processing gas and the cleaning fluid for cleaning may permeate into a space between the base material and the thermally sprayed film or between the base material and the anodic oxidized film to thereby generate a corrosion by-product on the surface of the base material by reaction of the gas and the cleaning fluid, resulting in peeling off of the thermally sprayed film.

In other words, in an internal member of a plasma processing vessel 100, as shown in FIG. 21A, a reaction by-product 103 such as CF polymer is deposited on a surface of a thermally sprayed film 102 on a base material 101 such as Al, but the reaction by-product 103 is removed regularly or irregularly, as shown in FIG. 21B among FIGS. 21A to 21D, by immersing it in a given cleaning fluid 104 or by another method. Then, as shown in FIG. 21C, a processing gas, a cleaning fluid, or a fluid reacted with the reaction by-product infiltrates into air pores of the thermally sprayed film 102, a boundary between the sprayed film 102 and the base material 101, or a portion damaged by plasma, the gas and the like to reach the surface of the base material 101. The aforementioned phenomenon is considered to cause the corrosion by-product to be formed on the surface of the base material 101 or the loss of anchor effect by smoothing the surface of the base material roughened to obtain the anchor effect, thus resulting in a portion 105 of the thermally sprayed film 102 being peeled off from the base material 101, as shown in FIG. 21D.

The above-mentioned $Al_2O_3$ and $Y_2O_3$ have high reactivity on water in the air and when they are used as the inner wall member of the processing vessel and the like, it is possible that a vacuum chamber, the processing vessel, may absorb plenty of water when it is open to the atmosphere or undergoes wet cleaning. And, the abundantly absorbed water in the chamber will be released from the inner wall of the vacuum chamber during process due to high temperature in the vacuum chamber or plasma discharge, which in turn will have adverse effects on the process, such as particle production by chemical reaction of the water with deposits or the inner wall of the vacuum chamber, a prolonged vacuum exhaust time, abnormal electricity discharge, and deterioration of film forming properties.

In this regard, reference patent 2 discloses a method for performing the vacuum exhaust in a short time, wherein a plasma produced is made to contact with the inner wall surface of a plasma producing chamber during a vacuum exhaust process in such a way that temperature of the inner wall is raised to thereby vaporize the adhered water molecules. Further, in reference patent 3, there is presented a technique in which a heater is installed in a lid member of a vacuum chamber and controlled to keep an inner wall of the vacuum chamber at a specified or at a higher temperature all the time during plasma treatment, so that the amount of water and organic matter adsorbed to the inner wall of the vacuum chamber is reduced and, at the same time, the adsorbed water and the organic matter are rapidly vaporized. Furthermore, in reference patents 4 and 5, there is offered a technique in which a removable shield member is installed on an inner wall of a vacuum chamber and instruction for cleaning and replacement of shield member is indicated when the time needed to reach a vacuum state exceeds a set time.

The techniques of the reference patents 2 to 5, however, cannot give a fundamental solution to the problems and the effect thereof is limited since all of them are dealing the situation after water is adsorbed.

reference patent 1: Japanese Patent Laid-Open Publication No. 8-339895 (page 3, FIG. 2)
reference patent 2: Japanese Patent Laid-Open Publication No. 8-181117
reference patent 3: Japanese Patent Laid-Open Publication No. 11-54484
reference patent 4: Japanese Patent Laid-Open Publication No. 11-54487 reference patent 5: Japanese Patent Laid-Open Publication No. 2002-124503

SUMMARY OF THE INVENTION

The present invention has been developed to solve the aforementioned problems in the conventional techniques. An object of the present invention is to provide a new, improved internal member of a plasma processing vessel capable of suppressing peeling off of a thermally sprayed film formed as a top coat layer.

Further, another object is to provide an internal member of a plasma processing vessel in which release of water in the plasma process is made difficult to occur.

In order to solve the above problems, in accordance with a first aspect of the present invention, there is provided an internal member of a plasma processing vessel including a base material and a film formed by thermal spraying of ceramic on a surface of the base material, wherein the film is formed of ceramic including at least one kind of element selected from the group consisting of B, Mg, Al, Si, Ca, Cr, Y, Zr, Ta, Ce and Nd, and at least a portion of the film is sealed by a resin.

In accordance with a second aspect of the present invention, there is provided an internal member of a plasma processing vessel including a base material and a film formed by thermal spraying of ceramic on a surface of the base material, wherein the film has a first ceramic layer formed of ceramic including at least one kind of element selected from the group consisting of B, Mg, Al, Si, Ca, Cr, Y, Zr, Ta, Ce and Nd and a second ceramic layer formed of ceramic including at least one kind of element selected from the group consisting of B, Mg, Al, Si, Ca, Cr, Y, Zr, Ta, Ce and Nd, and at least a portion of at least one of the first and the second ceramic layer is sealed by a resin.

In accordance with the first and the second aspect of the present invention, it is preferable that the resin is selected from the group consisting of SI, PTFE, PI, PAI, PEI, PBI and PFA.

In accordance with a third aspect of the present invention, there is provided an internal member of a plasma processing vessel including a base material and a film formed by thermal spraying of ceramic on the surface of the base material, wherein the film is formed of ceramic including at least one kind of element selected from the group consisting of B, Mg, Al, Si, Ca, Cr, Y, Zr, Ta, Ce and Nd, and at least a portion of the film is sealed by a sol-gel method.

In accordance with a fourth aspect of the present invention, there is provided an internal member of a plasma processing vessel including a base material and a film formed by thermal spraying of ceramic on a surface of the base material, wherein the film has a first ceramic layer formed of ceramic including at least one kind of element selected from the group consisting of B, Mg, Al, Si, Ca, Cr, Y, Zr, Ta, Ce and Nd and a second ceramic layer made of ceramic including at least one element selected from the group consisting of B, Mg, Al, Si, Ca, Cr, Y, Zr, Ta, Ce and Nd, and at least a portion of at least one of the first and the second ceramic layer is sealed by a sol-gel method.

In accordance with the third and the fourth aspect of the present invention, it is preferable that the sealing treatment is executed by using an element of the Group 3a in the periodic table.

In accordance with the first to the fourth aspect of the present invention, the ceramic may be at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

In accordance with a fifth aspect of the present invention, there is provided an internal member of a plasma processing vessel including a base material and a film formed on a surface of the base material, wherein the film has a main layer formed by thermal spraying of ceramic and a barrier coat layer formed of ceramic including an element selected from the group consisting of B, Mg, Al, Si, Ca, Cr, Y, Zr, Ta, Ce and Nd.

In accordance with the fifth aspect of the present invention, the barrier coat layer may be formed of at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. Further, the barrier coat layer may be a thermally sprayed film at least a portion of which is sealed by a resin, and it is preferable that the resin is selected from the group consisting of SI, PTFE, PI, PAI, PEI, PBI and PFA. Furthermore, the barrier coat layer may be a thermally sprayed film at least a portion of which is sealed by a sol-gel method, and it is preferable that the sealing treatment is executed by using an element of the Group 3a in the periodic table.

In accordance with a sixth aspect of the present invention, there is provided an internal member of a plasma processing vessel including a base material and a film formed on a surface of the base material, wherein the film has a main layer formed by thermal spraying of ceramic and a barrier coat layer formed of an engineering plastic between the base material and the main layer.

In accordance with the sixth aspect of the present invention, the engineering plastic may be selected from the group consisting of PTFE, PI, PAI, PEI, PBI, PFA, PPS and POM.

In accordance with the fifth and sixth aspects of the present invention, the main layer may be formed of at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

In accordance with a seventh aspect of the present invention, there is provided an internal member of a plasma processing vessel including a base material and a film formed on a surface of the base material, wherein the film is formed of ceramic including at least one element of the Group 3a in the periodic table, and at least a portion of the film is hydrated by vapor or high temperature hot water.

In accordance with an eighth aspect of the present invention, there is provided an internal member of a plasma processing vessel including a base material and a film formed on a surface of the base material, wherein the film has a first ceramic layer formed of ceramic including at least one kind of element of the Group 3a in the periodic table and a second ceramic layer formed of ceramic including at least one kind of element of the Group 3a in the periodic table, and at least a portion of at least one of the first and the second ceramic layer is hydrated by vapor or high temperature hot water.

In accordance with the seventh and eighth aspects of the present invention, the film is a thermally sprayed film formed by thermal spraying or a thin film formed by employing a technique for forming a thin-film. Further, it is preferable that the film is formed of ceramic is selected from $Y_2O_3$, $CeO_2$, $Ce_2O_3$ and $Nd_2O_3$.

In accordance with a ninth aspect of the present invention, there is provided an internal member of a plasma processing vessel including a base material and a film formed on a surface of the base material, wherein the film has a first ceramic layer formed of ceramic including at least one kind of element of the Group 3a in the periodic table and a second ceramic layer formed by thermal spraying of ceramic, and at least a portion of the first ceramic layer is hydrated by vapor or high temperature hot water.

In accordance with the ninth aspect of the present invention, a thermally sprayed film formed by thermal spraying or a thin film formed by employing a technique for forming a thin film can be used as the first ceramic layer. Further, it is preferable that the first ceramic layer is formed of ceramic selected from $Y_2O_3$, $CeO_2$, $Ce_2O_3$ and $Nd_2O_3$. Furthermore, it is preferable that the second ceramic layer is formed of at least one kind of ceramic selected from the group consisting of $B_4C$, $MgO$, $Al_2O_3$, $SiC$, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

In accordance with a tenth aspect of the present invention, there is provided an internal member of a plasma processing vessel including a base material and a film formed on a surface of the base material, wherein the film has a hydroxide layer formed of a hydroxide including at least one kind of element of the Group 3a in the periodic table.

In accordance with the tenth aspect of the present invention, a thermally sprayed film formed by thermal spraying or a thin film formed by employing a technique for forming a thin film can be used as the hydroxide layer. Further, it is preferable that the hydroxide layer is formed of hydroxide selected from $Y(OH)_3$, $Ce(OH)_3$ and $Nd(OH)_3$. Furthermore, at least a portion of the hydroxide layer may be sealed.

In accordance with the first to tenth aspects of the present invention, an anodic oxidized film may be formed between the base material and the film, and in this case, it is preferable that the anodic oxidized film is sealed by an aqueous solution of metal salt.

In accordance with an eleventh aspect of the present invention, there is provided an internal member of a plasma processing vessel, which is formed of a sintered ceramic body including at least one kind of element of the Group 3a in the periodic table, wherein at least a portion of the sintered ceramic body is hydrated by vapor or high temperature hot water. In this case, it is preferable that the sintered ceramic body is formed by hydrating of ceramic selected from $Y_2O_3$, $CeO_2$, $Ce_2O_3$ and $Nd_2O_3$.

In accordance with a twelfth aspect of the present invention, there is provided an internal member of a plasma processing vessel, which is formed of a sintered ceramic body including hydroxide including at least one kind of element of the Group 3a in the periodic table. In this case, it is preferable that the sintered ceramic body includes hydroxide selected from $Y(OH)_3$, $Ce(OH)_3$ and $Nd(QH)_3$.

DETAILED DESCRIPTION OF THE PREFERRED EMBODIMENTS

Hereinafter, the preferred embodiments of the present invention will be described in detail.

Figure 1:
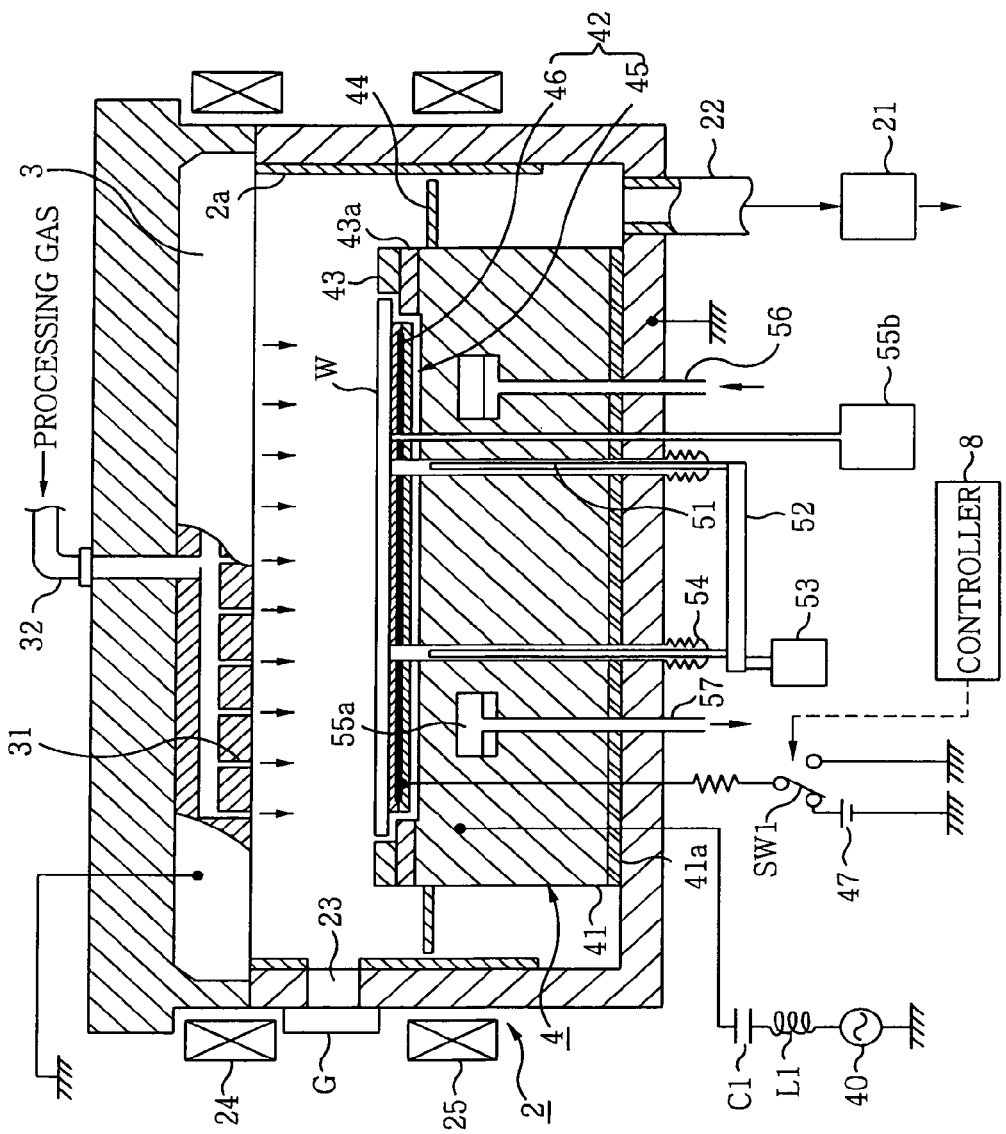
FIG. 1 is a vertical cross-sectional view of a plasma etching apparatus in which an internal member of a plasma processing vessel in accordance with preferred embodiments of the present invention is installed.

FIG. 1 is a vertical cross-sectional view of an example of a plasma etching processing apparatus, which is a plasma processing apparatus with an internal member of a plasma processing vessel, a subject of the present invention. A reference numeral 2 refers to a vacuum chamber included in the processing vessel, which is formed of a conductive material, such as aluminum, to have an airtight structure. And the vacuum chamber 2 is frame-grounded. Additionally, a cylindrical deposition shield 2a is disposed to an inner surface of the vacuum chamber 2 to prevent the inner surface from being damaged by plasma. Further, disposed in the vacuum chamber 2 are a gas shower head 3 serving also as an upper electrode and a mounting table 4 serving also as a lower electrode, which are installed to face each other. And connected to a lower surface is an exhaust pipe 22, which serves as a vacuum exhaust passageway communicating with a vacuum exhaust unit 21 having, e.g., a turbo molecular pump or a dry pump. Furthermore, an opening 23 for charging or discharging an object to be processed, e.g., a semiconductor wafer W, is formed on a sidewall portion of the vacuum chamber 2 and it can be opened or closed by a gate valve G. Permanent magnets 24 and 25, having, for example, a shape of ring, are mounted on an outside of a sidewall portion in such a manner that the opening 23 is located therebetween.

The gas shower head 3 has a plural number of holes 31 facing the object W to be processed on the mounting table 4, and is configured to supply a flow-controlled or pressure-controlled processing gas coming from an upper gas supply line 32 to a surface of the object W to be processed uniformly through the corresponding holes 31.

Disposed under the gas shower head 3 from about 5 mm to 150 mm apart therefrom, the mounting table 4 includes a cylindrical main body 41 which is formed of, for example, aluminum having its surface subjected to alumite treatment and is insulated by an insulating member 41a from the vacuum chamber 2; an electrostatic chuck 42 mounted on an upper surface of the main body 41; a circular focus ring 43 surrounding the electrostatic chuck 42; and an insulation ring 43a as a circular insulation member inserted between the focus ring 43 and the main body 41. Further, depending on a process, an insulating or conductive material is selected for the focus ring 43 to confine or diffuse reactive ions.

In the mounting table 4, for example, the body 41 thereof is connected to a high frequency power supply 40 via a capacitor C1 and a coil L1, and a high frequency power in a range of, e.g., from 13.56 MHz to 100 MHz is applied thereto.

Moreover, installed inside the mounting table 4 are a temperature control unit 55a of a cooling jacket and a heat transfer gas supply unit 55b to supply, e.g., He gas to a rear surface of the object W to be processed. A process surface of the object W to be processed, held on the mounting table 4, can be maintained at a desired temperature by activating the temperature control unit 55a and the heat transfer gas supply unit 55b. The temperature control unit 55a has an inlet line 56 and a discharge line 57 for circulating a coolant via the cooling jacket. The coolant regulated to be kept at an adequate temperature is provided into the cooling jacket by the inlet line 56, and the coolant after heat exchange is exhausted to outside by the discharge line 57.

A ring-shaped exhaust plate 44 having a plurality of exhaust holes punched therein is disposed between the mounting table 4 and the vacuum chamber 2 and installed at a position lower than a surface of the mounting table 4 in such a manner that it surrounds the mounting table 4. The exhaust plate 44 serves to optimally confine the plasma between the mounting table 4 and the gas shower head 3 and to regulate flows of exhaust current are regulated. Additionally, protrudently installed in the mounting table 4 are a plural number, for example, three, of elevating pins 51 (only two pins are shown) as elevating members for executing transfer of the object W to be processed between an external transfer arm (not shown) and the mounting table 4 such that the elevating pins 51 can be elevated and lowered by a driving unit 53 through a coupling member 52. A reference numeral 54 refers to a bellows for keeping the space between through holes of the elevating pins 51 and the atmosphere airtight.

In the plasma etching processing apparatus, after being transferred into the vacuum chamber 2 via the gate valve G and the opening 23, the object W to be processed is first mounted on the electrostatic chuck 42, the gate valve (G) is closed, and an inside of the vacuum chamber 2 is exhausted through the exhaust pipe 22 by the vacuum exhaust unit 21 to a predetermined degree of vacuum. Thereafter, when the processing gas is supplied to the inside of the vacuum chamber 2, a DC voltage is simultaneously applied from a DC power supply 47 to a chuck electrode 46, so that the object W to be processed is electrostatically attracted to be held by the electrostatic chuck 42. Under the condition, the high frequency power with a predetermined frequency is applied from the high frequency power supply 40 to the main body 41 of the mounting table 4 to thereby generate a high frequency electric field between the gas shower head 3 and the mounting table 4, which in turn transforms the processing gas into plasma used for performing an etching process on the object W to be processed on the electrostatic chuck 42.

As the processing gas, a gas including a halogen element, for example, a fluoride such as $C_4F_8$ and $NF_3$, a chloride such as $BCl_3$ and $SnCl_4$, and a bromide such as HBr, is used. Since a highly strong corrosive environment is generated inside the vacuum chamber 2 owing to this, a strong plasma resistance is imperatively required for the members within the vacuum chamber 2, that is, the internal members of the plasma processing vessel, for example, the deposition shield 2a, the exhaust plate 44, the focus ring 43, the shower head 3, the mounting table 4, the electrostatic chuck 42, and the inner wall member of the vacuum chamber 2.

Hereinafter, the internal member of the processing vessel as a subject of the present invention will be described in detail.

Embodiment 1

In a conventional case where a base material having a thermally sprayed film formed thereon a base material is used as an internal member of a processing vessel, a thermally sprayed film is bound to be peeled off. The present inventors have found in their investigation that the peeling off of the thermally sprayed film on the internal member of the plasma processing vessel is resulted from the fact that the processing gas and/or the cleaning fluid infiltrate through air pores (fine holes) of the thermally sprayed film, a boundary portion between the thermally sprayed film and the base material or a portion damaged by plasma and gas to thereby reach the base material, which ultimately corrodes a surface of the base material.

In other words, if a member of a processing vessel, where a plasma treatment has been performed by using a processing gas including a fluoride, is prepared to analyze a boundary surface (a base material surface) between the base material and the thermally sprayed film, F (fluorine) can be found therein. From this, it is suggested that F reacts on water (OH) to form HF, whereby the base material surface is corrosively changed (a corrosion by-product is generated), which leads to the peeling off of the thermally sprayed film.

Therefore, it is important that the boundary surface between the base material and the thermally sprayed film, i.e., the base material surface, is not exposed to the processing gas or the cleaning fluid.

Based on the aforementioned facts, in a first embodiment, a portion having barrier function which is hardly corroded is formed at a position between the surface of the sprayed film and the base material in the members within the vacuum chamber 2, i.e., the internal members of the plasma processing vessel, for example, the deposition shield 2a, the exhaust plate 44, the focus ring 43, the shower head 3, the mounting table 4, the electrostatic chuck 42 and the inner wall member of the vacuum chamber 2 shown in FIG. 1, even if it is exposed to the processing gas or the cleaning fluid, thus being capable of preventing the processing gas or the cleaning fluid from reaching the surface of the base material.

By forming the portion having the barrier function by using a high corrosion-resistant material, the surface of the base material can be protected from the processing gas or the cleaning fluid infiltrating through the air pores (the fine holes) of the thermally sprayed film. Additionally, if the portion having the barrier function is in contact with the base material, employing a material with high adhesivity for the portion makes it possible to protect the surface of the base material from infiltration of the processing gas or the cleaning fluid through a boundary surface between the portion having the barrier function and the surface of the base material.

Hereinafter, a concrete structure in accordance with the first embodiment will be described in detail.

Figure 2:
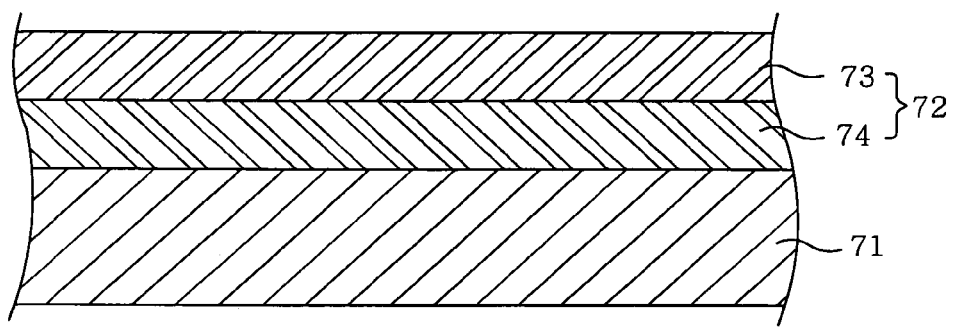
FIG. 2 shows a cross sectional view of a layer structure of a first example of an internal member of a plasma processing vessel in accordance with a first embodiment of the present invention.

First, as shown in FIG. 2, the internal member of the plasma processing vessel in accordance with the first example basically includes a base material 71 and a film 72 formed on its surface. The film 72 has a main layer 73 formed by thermal spraying and a barrier coat layer 74 formed between the base material 71 and the main layer, which has the barrier function to be rarely corroded even when exposed to the processing gas or the cleaning fluid.

Various types of steel including stainless steel (SUS), Al, Al alloy, W, W alloy, Ti, Ti alloy, Mo, Mo alloy, carbon, oxide or non-oxide based sintered ceramic body, carbonaceous material and the like are used properly for the base material 71 as an object on which the film 72 is constructed.

It is preferable that the barrier coat layer 74 is formed of ceramic including at least one kind of element selected from the group consisting of B, Mg, Al, Si, Ca, Cr, Y, Zr, Ta, Ce and Nd, and, more particularly, at least one kind of ceramic selected from the group consisting of $B_4C$, $MgO,Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. For example, products of TOCALO co., LTD. such as "CDC-ZAC" and "super ZAC" are applicable. "CDC-ZAC" is a complex ceramic including $Cr_2O_3$ as a main ingredient, and has features such as imporosity, high hardness, high adhesion and the like. On the other hand, super ZAC is a complex ceramic including $SiO_2$ and $Cr_2O_3$ as main ingredients, and has excellent heat-resistance and abrasion-resistance in addition to imporosity, high hardness and high adhesion. It is preferable to form the barrier coat layer 74 by a thermal spraying method. The thermal spraying method is a method for spraying raw material melted by a heat source such as combustion gas and electricity on a basic material to form a film. Further, the barrier layer 74 may be formed by employing a technique for forming a thin-film such as PVD and CVD method, an immersion method, a coating method, or the like. The PVD method is a method of coating various ceramic films coated at low temperature by employing an ion plating method, while the CVD method is a method for coating single layer or multiple layers at high temperature by a thermal chemical vapor deposition. Furthermore, the immersion method is a method for performing a heat treatment after immersing various materials being immersed into a resin solution, and the coating method is a method for performing the heat treatment at a predetermined temperature after various materials being coated with a resin solution. It is desirable that the barrier coat layer 74 is of a thickness ranging from 50 to 100 μm.

In this case, it is preferable to perform sealing by using a resin on at least one portion of the barrier coat layer 74, e.g., on a surface contacted with the base material 71, or on the whole of the barrier coat layer 74. It is desirable that the resin is selected from the group consisting of SI, PTFE, PI, PAI, PEI, PBI and PFA. That is, the barrier coat layer 74 made of ceramic has porosity with air pores (fine holes) when forming by using the aforementioned thermal spraying method, but sealing the fine holes in at least a portion of the porous layer with the resin can prevent the gas or the cleaning fluid from infiltrating through the fine holes of the main layer 73 made of the thermally sprayed film, thus protecting the base material 71 effectively.

Additionally, SI refers to silicon, PTFE to polytetrafluoroethylene-, PI to polyimide, PAI to polyamideimide, PEI to polyetherimide, PBI to polybenzimidazole, and PFA to perfluoroalkoxyalkane.

The sealing treatment may be executed by employing a sol-gel method. The sealing treatment employing the sol-gel method is performed by sealing with a sol (a colloidal solution) in which ceramic is dispersed in an organic solvent, and then by the gelation by heating. Accordingly, the sealing by using ceramic is substantialized, so that a barrier effect can be improved. It is preferable that a material selected from the elements of the Group 3a in the periodic table is used in the sealing treatment of this case. Among them, highly corrosion-resistant $Y_2O_3$ is desirable.

Moreover, engineering plastics may be used as another alternative material for the barrier coat layer 74. Specifically, a resin selected from the group consisting of PTFE, PI, PAI, PEI, PBI, PFA, PPS and POM is preferable and, for example, "Teflon (a registered trademark)" (PTFE), a product of DUPONT INC., and the like are applicable. These resins have excellent adhesivity and chemical resistance which are sufficient enough to stand against the cleaning fluid in cleaning.

Further, PTFE refers to polytetrafluoroethylene, PI to polyimide, PAI to polyamideimide, PEI to polyetherimide, PBI to polybenzimidazole, PFA to perfluoroalkoxyalkane, PPS to polyphenylenesulfide, and POM to polyacetal.

Figure 3:
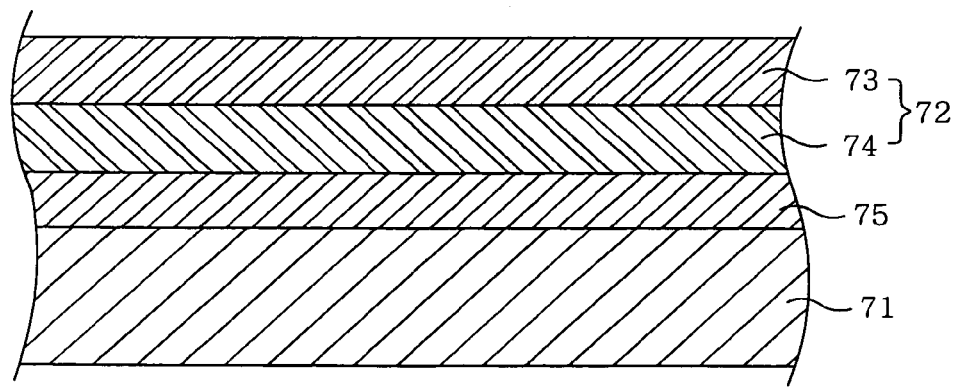
FIG. 3 shows a cross sectional view of an example in which an anodic oxidized film is added to the structure of FIG. 2.

Furthermore, an anodic oxidized film 75 may be formed between the base material 71 and the barrier coat layer 74 as depicted in FIG. 3. In this case, it is desirable that the anodic oxidized film is formed by organic acid, such as oxalic acid, chromic acid, phosphoric acid, acetic acid, formic acid or sulfonic acid, which will result in an oxidized film whose corrosion resistance is much better than those produced by an anodic oxidation treatment by sulfuric acid, so that it can further suppress the corrosion by the processing gas and the cleaning fluid. It is preferable that the anodic oxidized film 75 is of a thickness ranging from 10 to 200 μm.

As described above, in case the anodic oxidized film 75 is formed between the base material 71 and the barrier coat layer 74, sealing fine holes of the anodic oxidized film 75 can markedly improve corrosion resistance. In this case, a metal salt sealing is applicable, in which a material is immersed in hot water including metal salt such as Ni, so that, in fine holes of the oxidized film, an aqueous solution of metal salt is hydrolyzed, whereby hydroxide is precipitated, thus performing sealing. Further, the same effect can also be achieved even when the sealing treatment of the fine holes of the anodic oxidized film 75 is executed by using the resin (selected from the group consisting of SI, PTFE, PI, PAI, PEI, PBI and PFA) used in the sealing treatment of the barrier coat layer 74.

Furthermore, an anodic oxidized film (KEPLA-COAT a registered trademark) with a porous ceramic layer may be used as the anodic oxidized film 75 formed on the surface of the base material 71.

Further, the anodic oxidized film (KEPLA-COAT) is formed by immersing the base material as an anode in an alkali-based organic electrolyte to discharge an oxygen plasma therein.

It is preferable that the main layer 73 as the thermally sprayed film includes at least one kind of element selected from the group consisting of B, Mg, Al, Si, Ca, Cr, Y, Zr, Ta, Ce and Nd, and, to be more specific, it is preferable to include at least one kind of ceramic selected from the group consisting of $B_4C$, $MgO$, $Al_2O_3$, $SiC$, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. In this case, it is desirable that the main layer 73 is of a thickness ranging from 10 to 500 μm.

When the internal members of the plasma processing vessel with these structures are fabricated, it is preferable to increase adhesivity of the barrier coat layer 74 or the anodic oxidized film 75 to be formed on the surface of the base material 71 by executing a blast treatment for blowing up particles such as $Al_2O_3$, SiC or sand on the surface of the base material 71 to make the surface thereof microscopically uneven. Additionally, etching the surface, e.g., by immersion in a given medicinal fluid, is allowed as a method for making the surface uneven, not limiting the method to the aforementioned blast treatment.

Next, the aforementioned barrier coat layer 74 is formed directly on the base material 71 or through the anodic oxidized film 75 by employing the thermal spraying method or another proper method. If necessary, the sealing treatment as described above is executed. When the sealing treatment is performed, the aforementioned resin or sol of ceramic is coated on the surface of the barrier coat layer 74, or the base material 71 with the barrier coat layer 74 thereon is immersed in a resin sealing material or the sol of ceramic. In case the sealing is performed by the sol of ceramic, gelation by heating is followed by heating.

After forming the barrier coat layer 74, the main layer 73, a thermally sprayed film, is sequentially formed, wherein the layer is formed of at least one kind of ceramic selected from the group consisting of $B_4C$, $MgO$, $Al_2O_3$, $SiC$, $Si_3N_4$, $SiO_2$, $CaF_2$, $Cr_2O_3$, $Y_2O_3$, $YF_3$, $ZrO_2$, $TaO_2$, $CeO_2$, $Ce_2O$, $CeF_3$ and $Nd_2O_3$. In addition to selecting a material with excellent adhesivity as the barrier coat layer 74, the blast process and the like may be performed on the surface of the barrier coat layer 74 to further improve adhesivity with the main layer 73.

As described above, in this example, the problem that the thermally sprayed film 72 on the base material 71 is peeled off by generation of the corrosion by-product on the surface of the base material 71 can be solved by forming the barrier coat layer 74 made of material with excellent corrosion resistance against the processing gas including the halogen element or the cleaning fluid between the main layer 73 as the thermally sprayed film and the base material 71 in such a way that the surface of the base material 71 is not exposed to the processing gas (halogen element) or the cleaning fluid.

Hereinafter, a second example will be described.

Figure 4A:
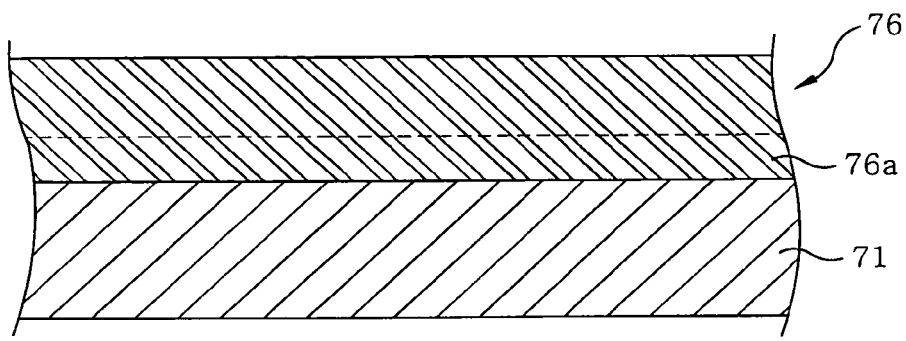
FIGS. 4A to 4C depict cross sectional views of layer structures of a second example of the internal member of the plasma processing vessel in accordance with the first embodiment of the present invention.
Figure 4B:
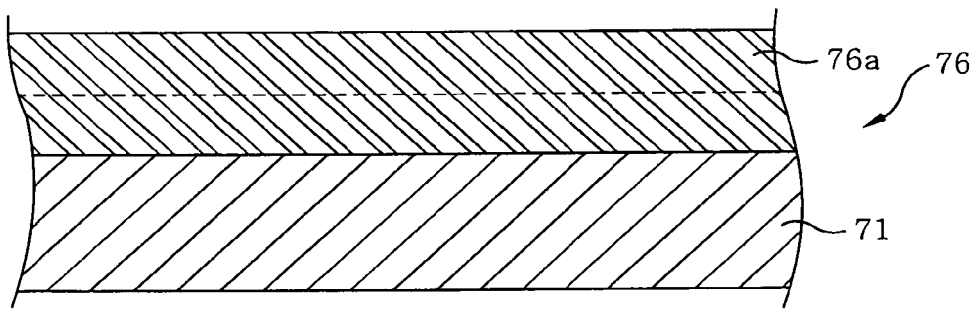
Figure 4C:
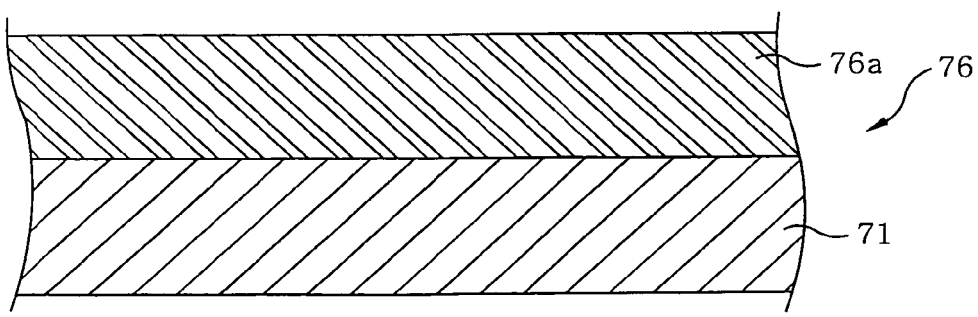

In the second example, as shown in FIGS. 4A, 4B and 4C, a film 76 is formed on the surface of the base material 71 by thermal spraying of ceramic and a sealing-treated portion 76a is formed in at least a portion of the film 76. The sealing-treated portion 76a is formed in a side of a portion of the film 76 making a contact with the base material 71 in an example of FIG. 4A, in a surface side of the film 76 in the example of FIG. 4B, and in the whole of the film 76 in the example of FIG. 4C, respectively.

It is preferable that the film 76 includes at least one kind of element selected from the group consisting of B, Mg, Al, Si, Ca, Cr, Y, Zr, Ta, Ce and Nd, and, to be more specific, at least one kind of ceramic selected from the group consisting of $B_4C$, $MgO$, $Al_2O_3$, $SiC$, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. In this case, it is desirable that the film 76 is of a thickness ranging from 50 to 300 μm. Further, the same material as in the first example can be used as the base material 71.

The sealing-treated portion 76a can be formed by sealing by employing an exactly same resin sealing or sol-gel method as executed on the barrier coat layer 74 in the first example. As described above, by forming the sealing-treated portion 76a, the gas or the cleaning fluid infiltrating through the fine holes of the film 76, i.e., the thermally sprayed film, can be effectively blocked, so that the base material 71 can be protected sufficiently. Because the sealing-treated portion 76a is for preventing the gas or the cleaning fluid from reaching the base material 71, any one of those shown in FIGS. 4A to 4C can be effective. However, forming the sealing-treated portion 76a on the side of a portion of the film 76 making a contact with the base material 71 as shown in FIG. 4A is more preferable. That is, if the internal member of the processing vessel whose thermally sprayed film has undergone the sealing treatment is used in a plasma atmosphere obtained by applying high frequency power in a high vacuum area (e.g., 13.3 Pa), a diluted organic solvent (e.g., ethyl acetate) in a sealing material may be evaporated, or the sealing material may be corroded by the plasma, the processing gas and the like, so that air pores (fine holes) may be formed in the thermally sprayed film again. Due to these air pores, surface state (e.g., temperature and adhesion state of a by-product) of the internal member of the processing vessel is changed with time, so that it is possible to exert baleful influence on the process in the processing vessel. Thus, as shown in FIG. 4A, by avoiding to perform the sealing treatment on the surface side portion of the film 76, surface degradation of the film 76 may be suppressed and the process can be executed stably. Additionally, the sealing-treated portion 76a may be formed, for example, in the middle of the film 76, without limiting the positions to those depicted in FIGS. 4A to 4C. It is desirable that the sealing-treated portion 76a is from 50 to 100 μm thick.

Figure 5:
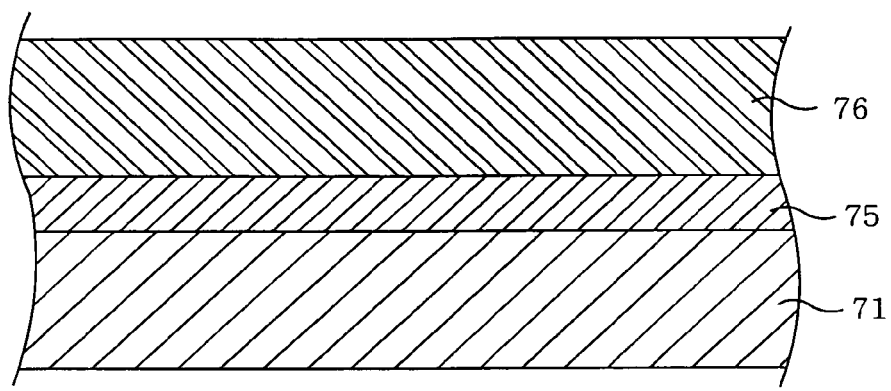
FIG. 5 depicts a cross sectional view of an example in which the anodic oxidized film is added to the structures of FIGS. 4A to 4C.

Also in this example, as shown in FIG. 5, exactly the same anodic oxidized film 75 as in the first example can be formed between the base material 71 and the film 76. Further, in this case, sealing the anodic oxidized film 75 is preferable and the same metal salt sealing as mentioned above is available for this sealing treatment.

Hereinafter, a third example will be described.

Figure 6A:
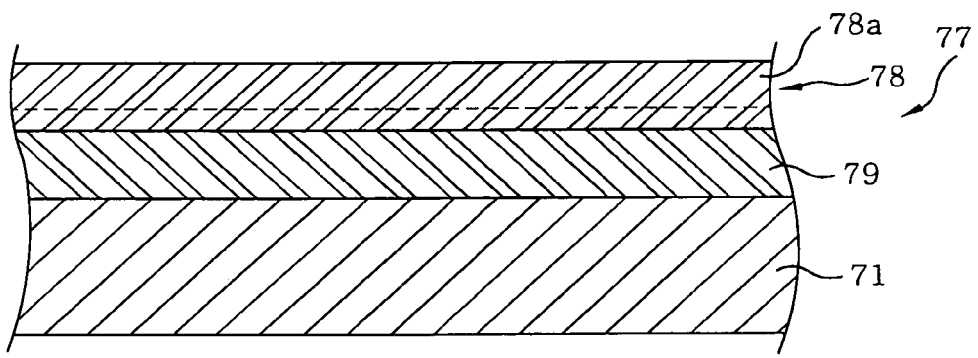
FIGS. 6A and 6B describe cross sectional views of layer structures of a third example of the internal member of the plasma processing vessel in accordance with the first embodiment of the present invention.
Figure 6B:
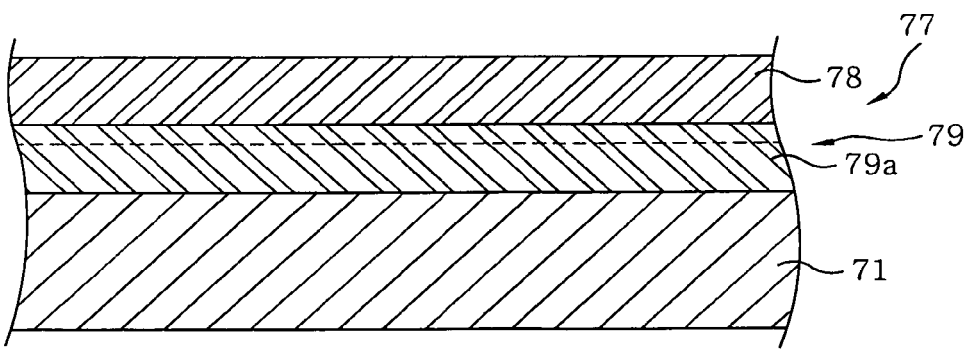

In the third example, as shown in FIGS. 6A and 6B, a film 77 is formed on the surface of the base material 71 by the thermal spraying of ceramic, the film 77 has a two-layer structure including a first ceramic layer 78 and a second ceramic layer 79, and a sealing portion is formed in at least a portion of at least one of them. In the example of FIG. 6A, a sealing-treated portion 78a is formed in the first ceramic layer 78 located at a surface side, and in the example of FIG. 6B, a sealing-treated portion 79a is in the second ceramic layer 79 located at a base material 71 side.

Both the first ceramic layer 78 and the second ceramic layer 79, being included in the film 77, include at least one kind of element selected from the group consisting of B, Mg, Al, Si, Ca, Cr, Y, Zr, Ta, Ce and Nd, and, to be more specific, include at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$ is preferable. In this case, it is desirable that the film 77 is from 50 to 300 μm thick. Further, exactly the same material as in the first example can be used as the base material 71.

The sealing-treated portions 78a and 79a may be formed by employing exactly the same resin sealing or sol-gel method as executed on the barrier coat layer 74 of the first example. As described above, by installing the sealing-treated portions 78a and 79a, the gas or the cleaning fluid infiltrating through the fine holes of the first and second ceramic layers 78 and 79, i.e., the thermally sprayed films, can be effectively blocked, so that the base material 71 can be protected sufficiently. Because the sealing-treated portions 78a and 79a are used for preventing the gas or the cleaning fluid from reaching the base material 71 as described above, positions of the sealing-treated portions 78a and 79a are not limited as long as their functions can be realized effectively, and the whole layer may also be used as the sealing-treated portion. Further, the sealing-treated portion may be formed in both sides of the first and second ceramic layers 78 and 79. It is desirable that the sealing-treated portions 78a and 79a are from 50 to 100 μm thick.

As described above, since, by allowing the film 77 formed on the base material 71 to have the two-layer structure, materials of these two layers can be appropriately selected in accordance with the required corrosion resistance and barrier property, it can be widely applied with a very high degree of freedom by performing the sealing treatment at a desired position. For example, the corrosion-resistance and the barrier property can be much enhanced if $Y_2O_3$ is used as the first ceramic layer 78 located toward the surface, $YF_3$ or $Al_2O_3$ is used as the second ceramic layer 79 located toward the base material 71 and the sealing is executed in at least a portion of the second ceramic layer 79.

Figure 7:
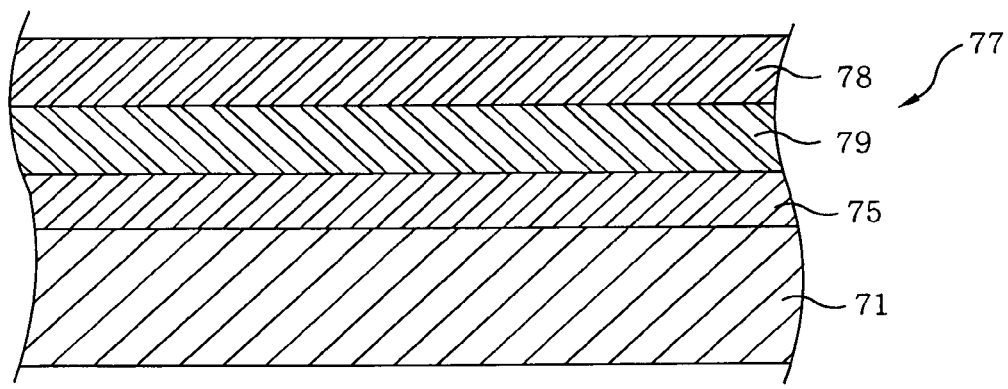
FIG. 7 describes a cross sectional view of an example in which the anodic oxidized film is added to the structures of FIGS. 6A and 6B.

As shown in FIG. 7, in this example, exactly the same anodic oxidized film 75 as in the first example may be formed between the base material 71 and the film 77. Further, in this case, sealing the anodic oxidized film 75 is preferable, wherein the same metal salt sealing and the like as mentioned above and the like are available.

In order to confirm the above description, following samples were prepared; a first sample was made by forming a thermally sprayed film of $Y_2O_3$ on a base material of Al alloy, a second sample was made by forming a thermally sprayed film of $Y_2O_3$ through a resin (PTFE) barrier coat layer on a base material of Al alloy; and a third sample was made by forming a thermally sprayed film of $Y_2O_3$ on a base material of Al alloy and sealing some of the thermally sprayed film with the resin. Then, the surface states of the thermally sprayed films were subject under plasma environment after dropping a HF solution on the surfaces of the first to the third samples to compare with each other. To be more specific, the samples were put under a plasma atmosphere of a CF-based gas for three minutes after dropping a 38% HF solution of 10 μl on each surface of the samples and being heated at 50° C. for three hours. As a result, it was found that a crack had developed on the whole surface of the first sample on which a countermeasure for peeling off of the thermally sprayed film had not been executed, while no crack had developed and the surfaces of the base materials were protected by preventing the infiltration of the processing gas and the cleaning fluid in the second sample where the barrier coat layer was formed between the base material and the thermally sprayed film and the third sample where some of the thermally sprayed film was sealed by the resin.

Embodiment 2

In a case where $Al_2O_3$ and $Y_2O_3$ are used in the wall member and other internal member of the plasma processing vessel, various problems occur since a large amount of water is absorbed due to high reactivity on water in the air when the vacuum chamber, i.e., the processing vessel, is open to atmosphere or undergoes the wet cleaning. However, the present inventors have found in their investigation that these problems can be solved by performing hydration treatment on ceramic, such as $Y_2O_3$, including an element of the Group 3a in the periodic table or forming a hydroxide including these elements.

Based on the above description, in the members within the vacuum chamber 2 in accordance with the second embodiment of the invention, i.e., the internal members of the plasma processing vessel, such as the deposition shield 2a, the exhaust plate 44, the focus ring 43, the shower head 3, the mounting table 4, the electrostatic chuck 42 and the inner-wall member of the vacuum chamber 2 in FIG. 1, a hydrated portion is formed of ceramic including the element of the Group 3a in the periodic table, or at least a portion of that is formed of hydroxide including that element.

In the internal member of the plasma processing vessel made in this way, release of water hardly occurs during the plasma process since the structure makes it difficult to adsorb water and release water therefrom.

Figure 8:
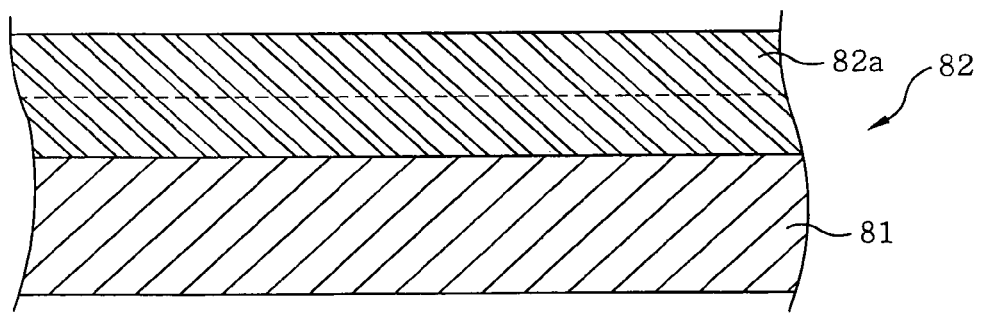
FIG. 8 illustrates a cross sectional view of a layer structure of a first example of an internal member of a plasma processing vessel in accordance with a second embodiment of the present invention.

First, in a first example, as shown in FIG. 8, a film 82 made of ceramic including an element of the Group 3a in the periodic table is formed on a base material 81 and a hydration-treated portion 82a is formed, for example, at least in a surface portion of the film 82.

Various types of steel including stainless steel (SUS), Al, Al alloy, W, W alloy, Ti, Ti alloy, Mo, Mo alloy, carbon, oxide and non-oxide based sintered ceramic body, carbonaceous material and the like are used properly for the base material 81 in a similar manner to the base material 71.

The film 82 may be made of ceramic including an element of the Group 3a in the periodic table, but it is preferable to be made of oxide including the element of the Group 3a in the periodic table. Further, among these, $Y_2O_3$, $CeO_2$, $Ce_2O_3$ and $Nd_2O_3$ are preferable and, among them, $Y_2O_3$ is particularly desirable since it has been conventionally and widely used and has high corrosion resistance.

The film 82 can be formed preferably by employing a technique for forming a thin-film such as the thermally sprayed method and the PVD and CVD method. Further, it is possible to form the film by employing the immersion method, the coating method or the like.

The hydration-treated portion 82a can be formed, for example, by making the film 82 react on water vapor or high temperature hot water to cause a hydration reaction. In case of using $Y_2O_3$ as the ceramic, the reaction such as an equation (1) below occurs:

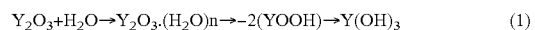

$$Y_2O_3 + H_2O \rightarrow Y_2O_3.(H_2O)n \rightarrow -2(YOOH) \rightarrow Y(OH)_3 \qquad (1)$$

wherein mantissa is not considered in Eq(1).

As represented in the equation (1), by the hydration treatment, Y hydroxide is formed in the end. In case of another element of the Group 3a in the periodic table, such hydroxide is formed by almost the same reaction. $Y(OH)_3$, $Ce(OH)_3$ and $Nd(OH)_3$ are preferable for such hydroxide.

Figure 9A:
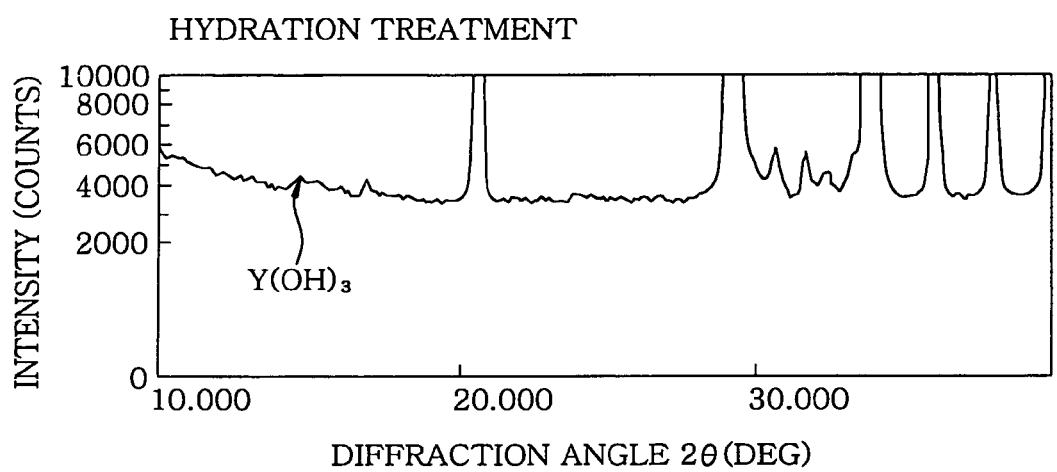
FIGS. 9A and 9B illustrate drawings comparing patterns of X-ray analysis of a case where hydration treatment is executed on a $Y_2O_3$ film and a case where the hydration treatment is not executed.
Figure 9B:
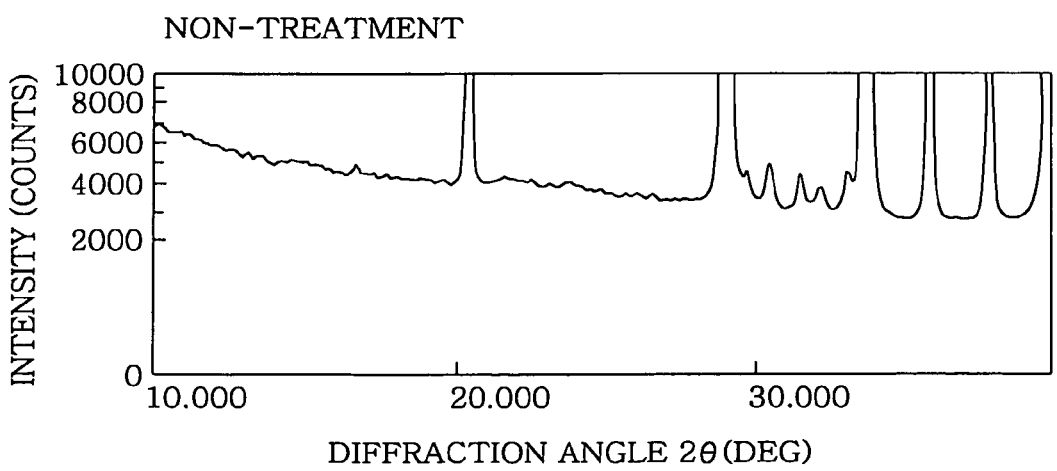

In order to confirm this, samples having the thermally sprayed film of $Y_2O_3$ on the base material were prepared, and X-ray diffraction measurement was performed on the one sample which was hydrated by immersion in high temperature hot water maintained at a temperature of 80° C. for 150 hours and then dehydrated at room temperature, and on another sample on which these treatments were not performed. The comparison result showed that $Y(OH)_3$ was detected only in the sample on which the hydration treatment was performed, confirming that hydroxide was formed by the hydration treatment, as shown in FIGS. 9A and 9B.

The hydroxide of the element of the Group 3a in the periodic table is highly stable and has features that chemically adsorbed water is difficult to be released and it is difficult to adsorb water. The problem caused by water during the process can be avoided by forming the hydroxide like this by the hydration treatment.

Figure 10:
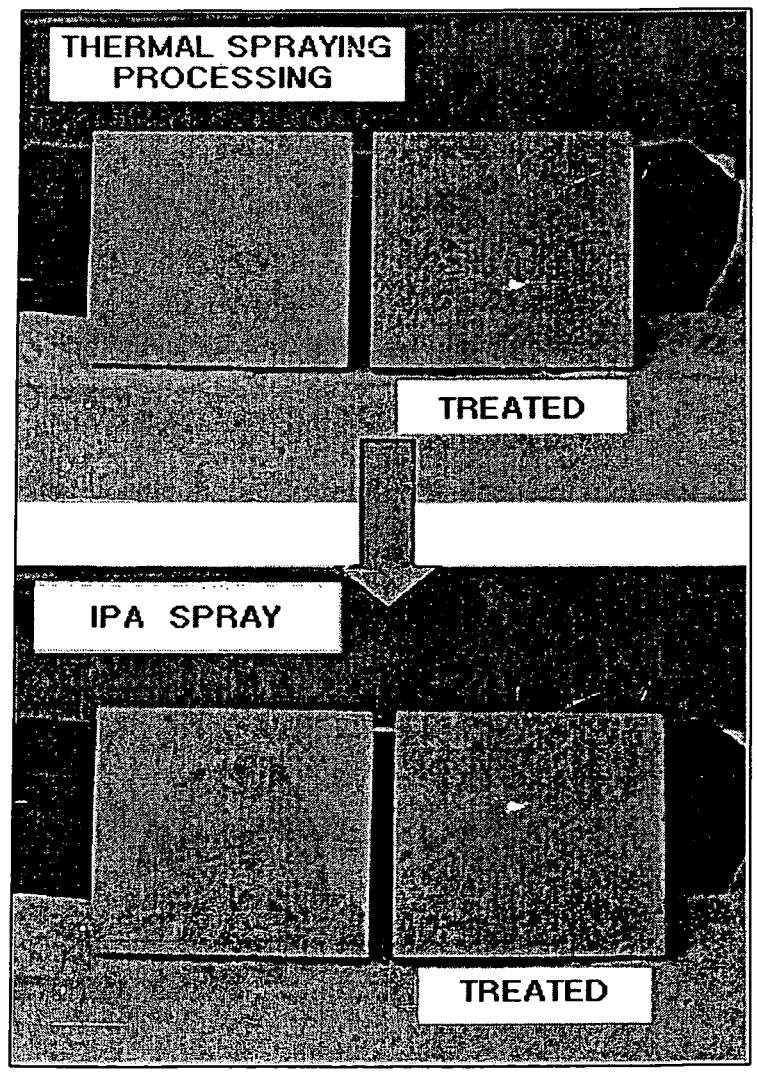
FIG. 10 illustrates drawings comparing adsorption of IPA of a case where the hydration treatment is executed on the $Y_2O_3$ film and a case where the treatment is not executed.

In order to confirm an effect of the hydration treatment, after preparing samples which had a 200 μm thick film of thermally sprayed $Y_2O_3$ on the base material, one sample was treated by boiling water for three hours, while another sample was not treated by boiling water. IPA was sprayed on both of them. IPA spraying becomes an acceleration test since IPA has higher adsorption than water. The test showed that IPA was adsorbed to the non-hydrated sample but no adsorption occurred to the hydrated sample, as shown in FIG. 10. From this, it was confirmed that the hydration treatment made it difficult for adsorption to occur.

Figure 11A:
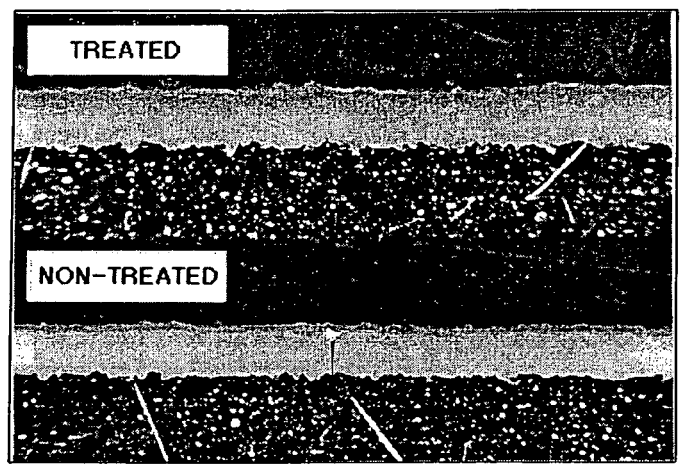
FIGS. 11A to 11C illustrate drawings comparing penetrations into resin of a case where the hydration treatment is executed on the $Y_2O_3$ film and a case where the treatment is not executed.
Figure 11B:
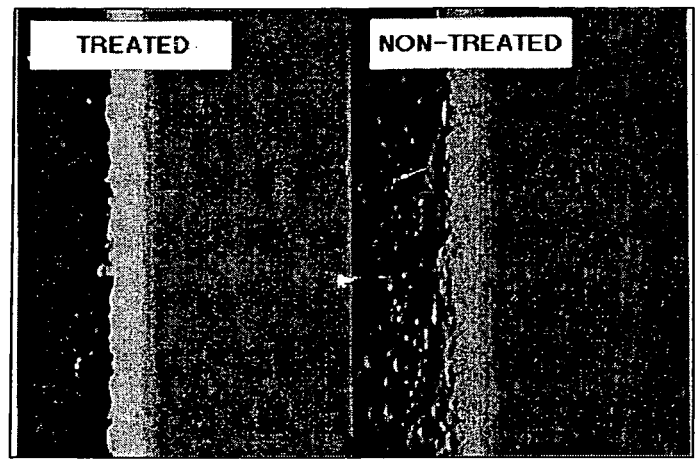
Figure 11C:
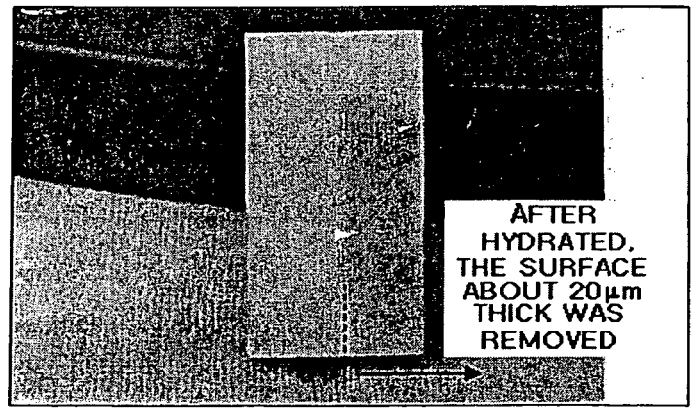

Next, in the same way, after preparing samples which had a 200 μm thick film of thermally sprayed $Y_2O_3$ on the base material, a sample was treated by boiling water for three hours while another sample was not treated by boiling water. Both of them were coated by the resin and cut to check cross sections thereof. The result, depicted in FIGS. 11A and 11B, showed that there were no differences on the surface states of the both samples. However, for the sample without the treatment, the film was transparent on the whole, confirming that the resin penetrated through the whole film. On the other hand, for the treated sample, only small portion close to the surface was transparent and the inside was white in the treated sample, indicating that the resin was hardly penetrated to the inside of the treated sample. That verifies that the hydration treatment causes hydrophobic property. Further, as shown in FIG. 11C, when the film about 20 μm thick from the surface was removed after the hydration treatment, it was found that the removed portion was transparent and hydrophobic property was reduced.

Moreover, an effect of $H_2O$ on a $Y_2O_3$ surface has been described in detail in a paper entitled "Specific Adsorption Behavior of Water on a $Y_2O_3$ Surface" of Kuroda et al. disclosed on pages 6937 to 6947 of Langmuir, Vol. 16, No. 17, 2000.

Hereinafter, the hydration treatment will be described in detail.

The hydration treatment can be executed by heat treatment in an environment containing abundant water vapor or treatment in boiling water. Several water molecules can be attracted toward neighborhood of, e.g., an yttrium oxide $(Y_2O_3)$ molecule to be combined together into one stable molecule cluster. At this time, main parameters include partial pressure of water vapor, temperature and time of heat treatment and the like. For example, a stable hydroxide can be formed by heat treatment for about 24 hours in a furnace with temperature ranging from about 100 to about 300° C. under relative humidity which is equal to or greater than 90%. If relative humidity and temperature of heat treatment are low, it is preferable to prolong the time of treatment. Treatment at high temperature and high pressure is desirable for efficient hydration treatment. Because the hydration reaction on the surface of yttrium oxide can proceed basically even at room temperature if executed for a long time, the same final state can be obtained also under other conditions besides the above condition. Further, in the hydration treatment, using water including ion (alkali water with a pH higher than 7) results in a hydroxide with a better hydrophobic property than for the case using pure water.

Furthermore, not limited to the hydration treatment, other methods, for example, forming hydroxide at a raw material step, may be employed as long as the hydroxide is formed finally. In case of making the film by the thermal spraying method, because the raw material is exposed to high temperature, there is a concern that the hydroxide may be changed into an oxide if hydroxide is formed at the raw material step, but, even in this case, a hydroxide film can be formed by thermally spraying under a condition of high humidity. Instead of forming the hydration-treated portion like this, the hydroxide may be formed directly by using a different method.

The hydration-treated portion or hydroxide layer should be formed in a surface portion of the film 82 in order that the film 82 has a structure difficult to adsorb water and be released from water. It is desirable that the hydration-treated portion or hydroxide film of this case is equal to or greater than 100 μm thick and the thickness thereof is set optimally depending on usage place.

Figure 12A:
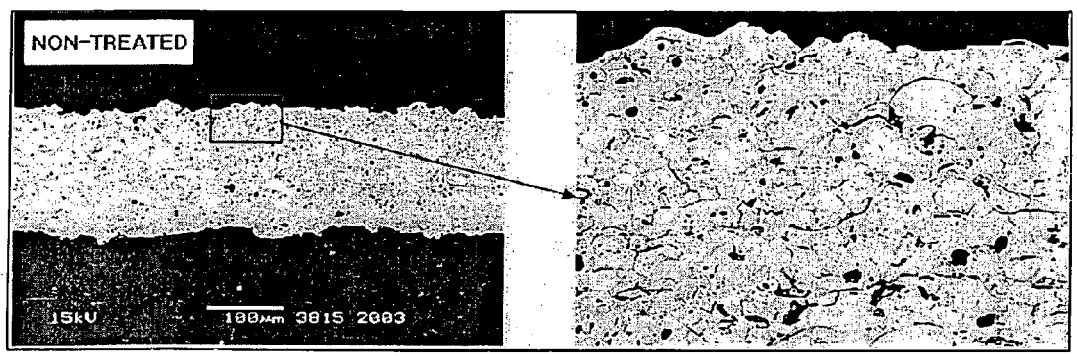
FIGS. 12A and 12B are photographs of a scanning electron microscope showing layer states before and after the hydration treatment.
Figure 12B:
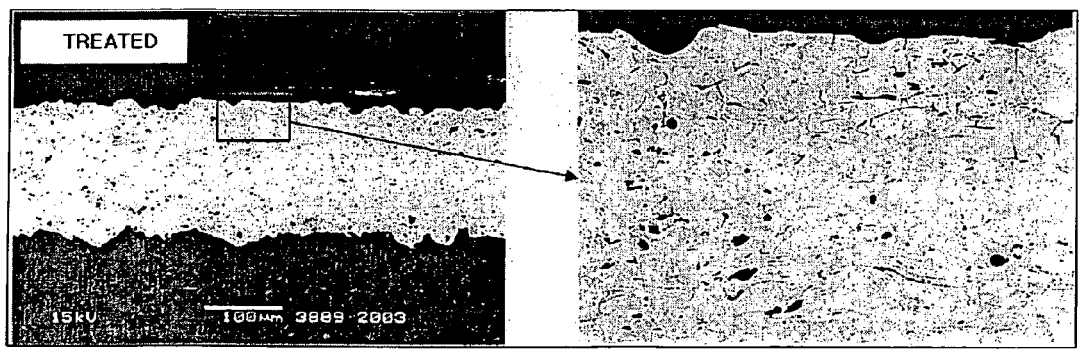

Densification is also promoted by the hydration treatment for the ceramic including the element of the Group 3a in the periodic table. For example, the $Y_2O_3$ film formed by the thermal spraying is porous before the hydration treatment as shown FIG. 12A, but it is densified by the hydration treatment as shown in FIG. 12B. By becoming dense like this, the same barrier effect as in the first embodiment is obtained in addition to the above effect.

Figure 13:
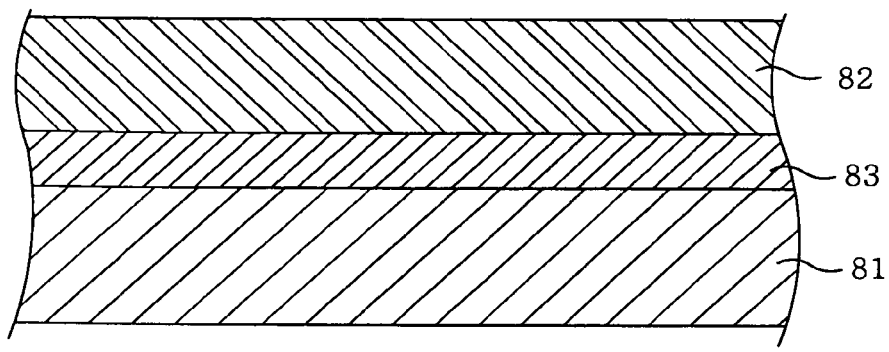
FIG. 13 illustrates a cross sectional view of an example in which an anodic oxidized film is added to the structure of FIG. 8.

In view of obtaining only the barrier effect, the hydration-treated portion 82a of the hydroxide formed by the hydration treatment need not be located necessarily in the surface portion of the film 82, and it may be formed at any position of the film 82. In a case of forming the hydroxide layer of the hydroxide formed by another method, it is desirable to perform the sealing by the resin or sol-gel method as mentioned above. In this example, in a similar way to the first embodiment, as depicted in FIG. 13, exactly the same anodic oxidized film 83 as in the first embodiment may be formed between the base material 81 and the film 82. Further, it is preferable to perform the sealing treatment on the anodic oxidized film 83 in a similar way to the first embodiment, and, as this sealing treatment, the metal salt sealing identical to the aforementioned one is available.

Hereinafter, a second example will be described.

Figure 14A:
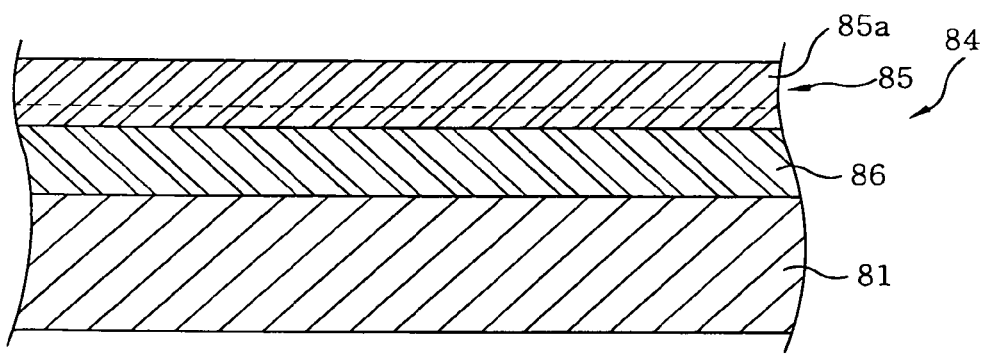
FIGS. 14A and 14B show cross sectional views of layer structures of a second example of the internal member of the plasma processing vessel in accordance with the second embodiment of the present invention.
Figure 14B:
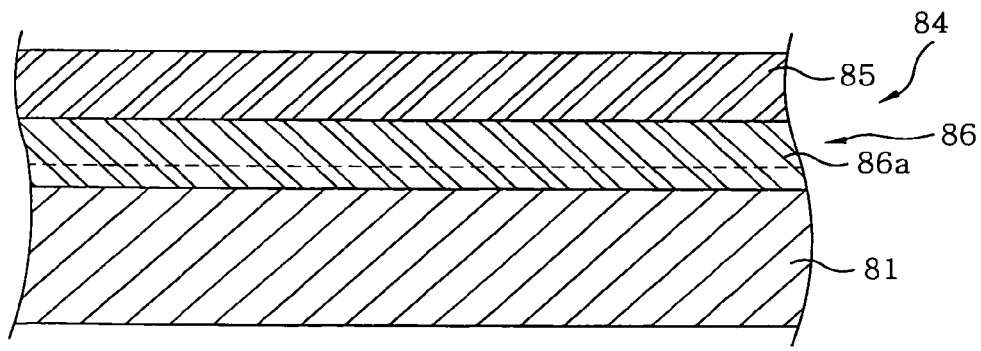

In the second example, as shown in FIGS. 14A and 14B, a film 84 is formed in the surface of the base material 81, it has two-layer structure including a first ceramic layer 85 and a second ceramic layer 86, and a hydration-treated portion is formed in at least a portion of at least one of the first and the second ceramic layer. A hydration-treated portion 85a is formed in a surface side of the first ceramic layer 85 in the example of FIG. 14A, and a hydration-treated portion 86a is formed in a side of the second ceramic layer 86 making a compact with the base material 81 in the example of FIG. 14B.

Both the first ceramic layer 85 and the second ceramic layer 86 included in the film 84 are formed of ceramic including an element of the Group 3a in the periodic table and, an oxide including an element of the Group 3a in the periodic table is preferable. Among them, $Y_2O_3$, $CeO_2$, $Ce_2O_3$ and $Nd_2O_3$ are preferable, and particularly, $Y_2O_3$ is preferable. Furthermore, exactly the same material as in the first example can be used as the base material 81.

These first and second ceramic layers 85 and 86 can be formed preferably, in a similar way as the film 82 in the first example, by employing the technique for forming a thin-film such as the thermal spraying method, the PVD method or the CVD method. Further, it is possible to form them by employing an immersion method, a coating method, or the like.

The hydration-treated portions 85a and 86a can be formed in exactly the same way as the hydration-treated portion 82a in the first example. If the hydration-treated portion is disposed in the surface portion of the film 84 as shown in FIG. 14A, a structure making adsorbing water or being released from water difficult can be formed, and, if the hydration-treated portion is in the film 84, as shown in FIG. 14B, the barrier effect can be made work effectively. In order to form the hydration-treated portion in the film 84, after fabricating the second ceramic layer 86 on the base material 81, the hydration treatment is performed and the first ceramic layer 85 is formed. It is desirable that the hydration-treated portions 85a and 86a are of thickness equal to or greater than 100 μm.

By forming the film 84 on the base material 81 in the two-layer structure like this, it can widen the scope of its applicability with large degree of freedom, since materials of the two layers and position of the hydration treatment can be selected to better accommodate various specific requirements of the situation.

Figure 15:
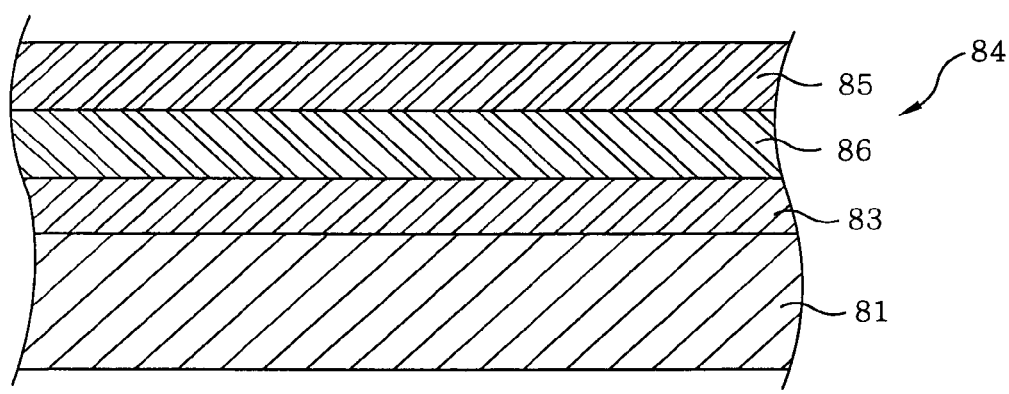
FIG. 15 shows a cross sectional view of an example in which the anodic oxidized film is added to the structures of FIGS. 14A and 14B.

In this example, the same anodic oxidized film 83 as in the first example may be formed between the base material 81 and the film 84, as shown in FIG. 15.

Hereinafter, a third example will be described.

Figure 16:
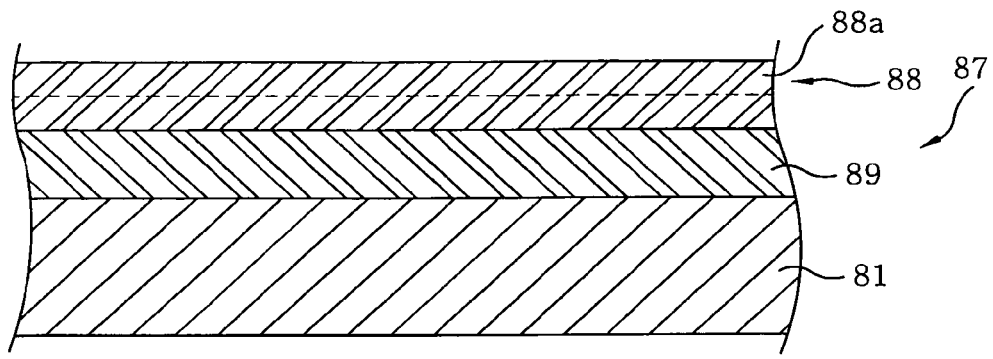
FIG. 16 depicts a cross sectional view of a layer structure of a third example of the internal member of the plasma processing vessel in accordance with the second embodiment of the present invention.

In the third example, as shown in FIG. 16, a film 87 is formed on the surface of the base material 81, and it has a first ceramic layer 88 formed of ceramic including at least one kind of element of the Group 3a in the periodic table; and a second ceramic layer 89 formed by thermal spraying of ceramic, wherein a hydration-treated portion 88a formed in a surface portion of the first ceramic layer 88.

As the ceramic of the first ceramic layer 88 including the element of the Group 3a in the periodic table, the oxide including the element of the Group 3a in the periodic table is preferable. Among them, $Y_2O_3$, $CeO_2$, $Ce_2O_3$ and $Nd_2O_3$ are preferable and $Y_2O_3$ is particularly preferable. It is desirable that the first ceramic layer 88 is of thickness ranging from 100 to 300 μm. The first ceramic layer 88 can be formed preferably, in a similar way to the film 82 in the first example, by employing the technique for forming a thin-film such as the thermally spraying method, the PVD method and the CVD method. Further, it is possible to form the layer by employing the immersion method, the coating method, or the like.

It is preferable that the second ceramic layer 89 includes at least one kind of element selected from the group consisting of B, Mg, Al, Si, Ca, Cr, Y, Zr, Ta, Ce and Nd, and, to be more specific, at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. It is desirable that the second ceramic layer 89 is of thickness ranging from 50 to 300 m. Further, exactly the same material as in the first example can be used as the base material 81.

The hydration-treated portion 88a can be formed in the same way as the hydration-treated portion 82a in the first example. Because the hydration-treated portion is formed in the surface portion of the film 87, the film 87 can be made to have a structure difficult to adsorb water and release water. In addition, the barrier effect may be made work effectively by forming the hydration-treated portion 88a inside the first ceramic layer 88. It is desirable that the hydration-treated portion 88a is of thickness equal to or greater than 100 μm.

Figure 17:
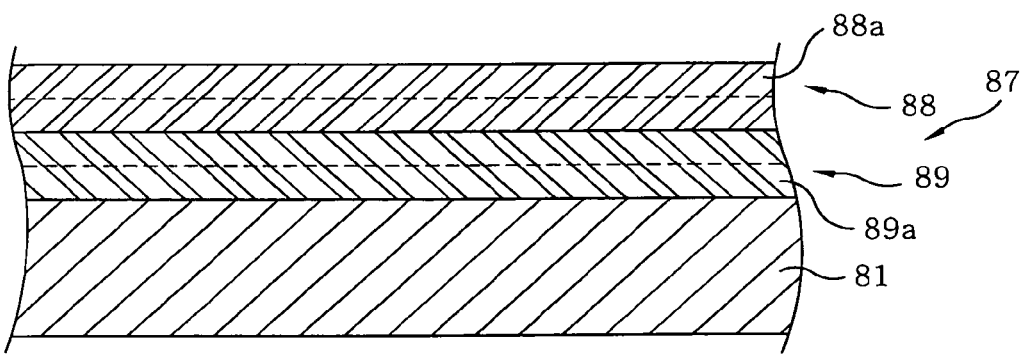
FIG. 17 depicts a cross sectional view of a layer structure of the third example of the internal member of the plasma processing vessel in accordance with the second embodiment of the present invention.

As shown in FIG. 17, it is preferable to form a sealing-treated portion 89a in the second ceramic layer 89. The sealing-treated portion 89a can be formed by using the same resin sealing or sol-gel method as described in the above-mentioned first embodiment. The base material 81 can be protected sufficiently by installing the sealing-treated portions 89a since the gas or the cleaning fluid infiltrating through fine holes of the second ceramic layer 89, i.e., the thermally sprayed film, can be blocked effectively. Further, the sealing-treated portion 89a can be formed at any position of the second ceramic layer 89.

By forming the structures as shown in FIGS. 16 and 17, the film 87 can have a structure difficult to adsorb water and release water by the hydration-treated portion 88a of the first ceramic layer 88, simultaneously having excellent corrosion-resistance. Besides, the base material 81 can be protected effectively by the barrier effect of the second ceramic layer 89. Particularly, in the structure shown in FIG. 17, the existence of the sealing-treated portion 89a can further enhance the barrier effect.

Figure 18:
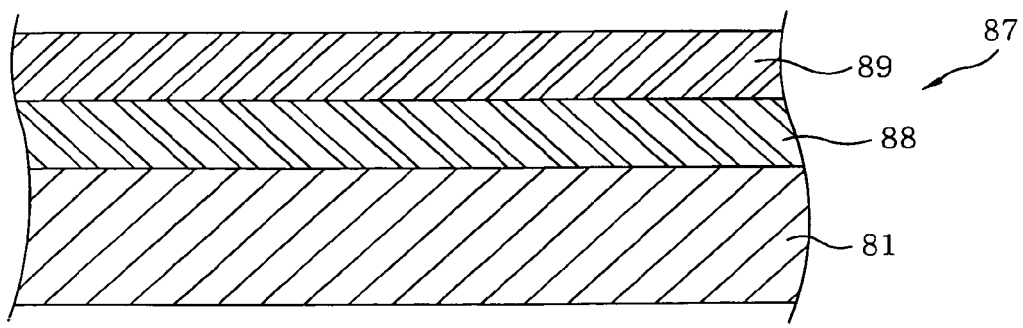
FIG. 18 depicts a cross sectional view of a layer structure of the third example of the internal member of the plasma processing vessel in accordance with the second embodiment of the present invention.

Moreover, as shown in FIG. 18, the first ceramic layer 88 and the second ceramic layer 89 may be installed in a reversed order. In this case, protection effect on the base material 81 may be improved since the hydration-treated portion 88a of the first ceramic layer 88 laid out next to the base material 81 can enhance the barrier effect effectually.

Figure 19:
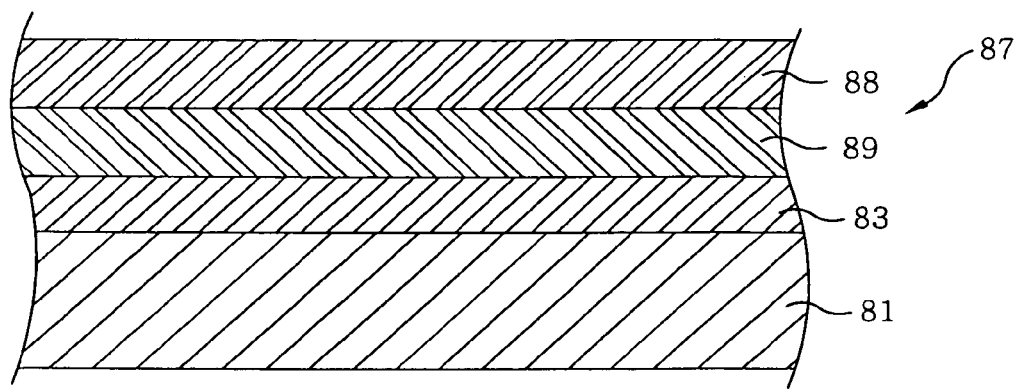
FIG. 19 describes a cross sectional view of an example in which the anodic oxidized film is added to the structure of FIG. 16.

In this example, as shown in FIG. 19, the same anodic oxidized film 83 as in the first example may be formed between the base material 81 and the film 87.

Hereinafter, the Third Embodiment will be Described

Figure 20:
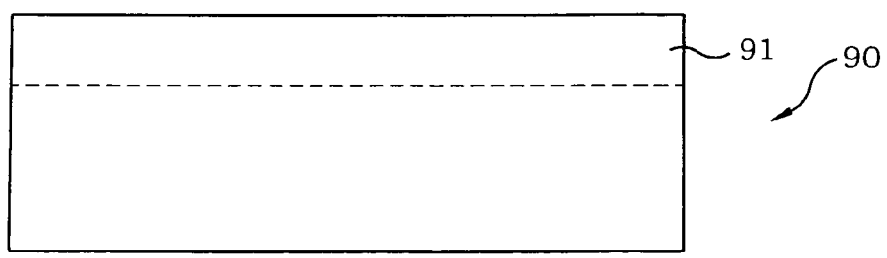
FIG. 20 illustrates a diagram of an internal member of a plasma processing vessel in accordance with a third embodiment of the present invention.
Figure 21A:
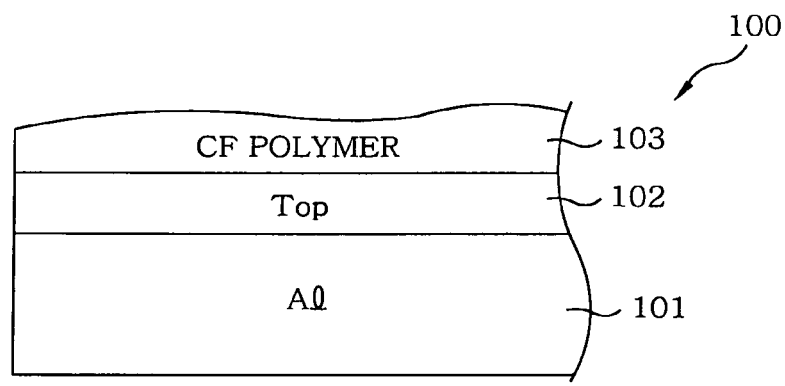
FIGS. 21A to 21D illustrate a diagrammatic drawing showing states of peeling off of a thermally sprayed film (a top coat layer) in a conventional internal member of a plasma processing vessel.
Figure 21B:
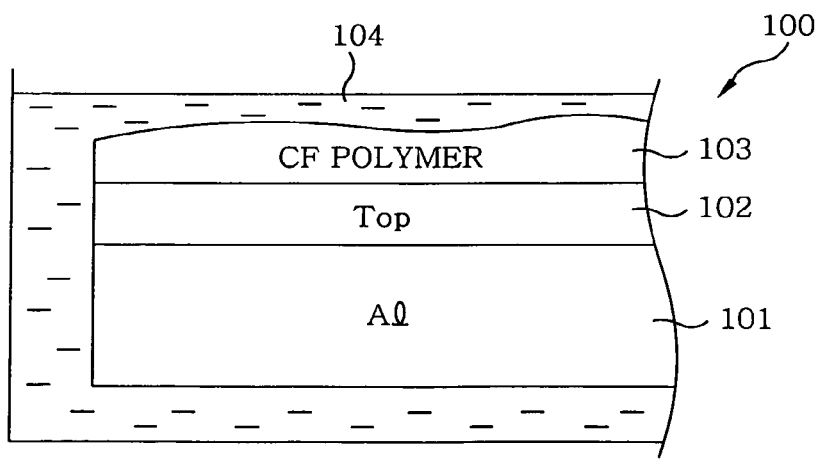
Figure 21C:
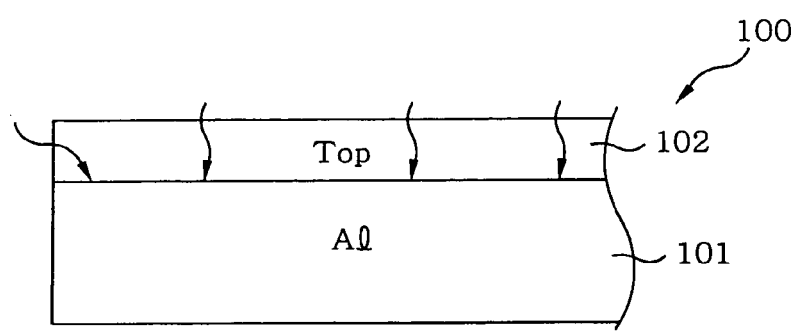
Figure 21D:
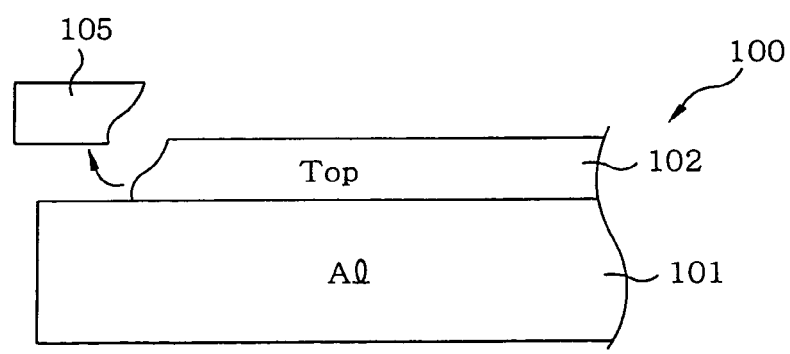

In the internal member of the plasma processing vessel in accordance with this embodiment, as shown in FIG. 20, a hydration-treated portion 91 is formed in a surface portion of a sintered ceramic body 90 including the element of the Group 3a in the periodic table. The hydration-treated portion 91 can be formed in the same manner as in the second embodiment, and the hydration treatment generates the hydroxide including the element of the Group 3a in the periodic table.

The hydration-treated portion 91 is formed in the surface portion, so that a structure making it difficult to adsorb water or release water is formed. It is desirable that the hydration-treated portion 91 or the hydroxide film of this case is of thickness equal to or greater than 100 μm.

In this embodiment, as in the second embodiment, ceramic including an element of the Group 3a in the periodic table or oxide including an element of the Group 3a in the periodic table. Among them, $Y_2O_3$, $CeO_2$, $Ce_2O_3$ and $Nd_2O_3$ are preferable and, in particular, $Y_2O_3$ is desirable.

Additionally, the present invention is not limited to the above embodiments and various changes and modifications can be made. For example, in the above embodiments, the case of applying the present invention to the internal members of the plasma processing vessel of a parallel plate plasma etching apparatus of a magnetron type using a permanent magnet, i.e., the deposition shield 2a, the exhaust plate 44, the focus ring 43, the shower head 3, the mounting table 4, the electrostatic chuck 42, and the inner wall member of the vacuum chamber 2 has been described as an example, but the present invention is not limited to the apparatus of this structure, and can be applied to internal members of the plasma processing vessel used in a parallel plate plasma etching apparatus having no magnetron; another plasma etching processing apparatus and etching apparatus such as an inductively coupled one; an apparatus executing various plasma processes such as an ashing and a film forming process in addition to etching; and a plasma processing apparatus executing the process on a glass substrate for LCD as well as a semiconductor wafer.

The internal member of the plasma processing vessel in accordance with the present invention is desirable for a plasma process in an environment of high corrosion, in particular, since the film formed on the base material is formed of ceramic with high corrosion resistance and a portion is formed to function as a barrier. Further, it is preferable as an internal member of a plasma processing vessel with a problem of water, because its structure is stable against water by executing the hydration treatment on the ceramic including an element of the Group 3a in the periodic table.

In accordance with the present invention, in internal members of a plasma processing vessel of a structure having a base material and a film formed by thermal spraying, peeling off of the film formed by thermal spraying is suppressed since a surface of the base material is not exposed to a processing gas or a cleaning fluid by preparing several layers functioning as a barrier.

Further, in accordance with the present invention, an internal member of a plasma processing vessel which is difficult to release water in plasma process can be obtained, because a structure making it difficult to adsorb water and release water is formed by performing the hydration treatment on the ceramic including at least one kind of element of the Group 3a in the periodic table, or by forming a layer or sintered body having the hydroxide including at least one kind of element of the Group 3a in the periodic table.

While the invention has been shown and described with respect to the preferred embodiments, it will be understood by those skilled in the art that various changes and modifications may be made without departing from the spirit and scope of the invention as defined in the following claims.

What is claimed is:

1. An internal member of a plasma processing vessel, comprising:
    a base material, wherein the base material comprises at least one of stainless steel, Al, Al alloy, W, W alloy, Ti, Ti alloy, Mo, Mo alloy, carbon, oxide or non-oxide based sintered ceramic body, and carbonaceous material; and
    a film formed on a surface of the base material, the film having pores therein,
    wherein the film includes a first ceramic layer and a second ceramic layer, the second ceramic layer formed in contact with the base material,
    wherein the first and second ceramic layers include at least one kind of element selected from the group consisting of B, Mg, Al, Si, Ca, Cr, Y, Zr, Ta, Ce and Nd, and at least parts of the pores in the film is sealed by a sol-gel method using $Y_2O_3$ to form a sealing-treated portion,
    wherein the sealing treated portion is formed in a lower portion of the second ceramic layer to make a contact with the base material, and
    wherein the sealing-treated portion is not formed in an upper portion of the film to suppress surface degradation of the film.

2. The internal member of claim 1, wherein an anodic oxidized film is formed between the base material and the film.

3. The internal member of claim 1, wherein the first ceramic layer is $Y_2O_3$ and the second ceramic layer is $Al_2O_3$.

4. The internal member of claim 1, wherein the first and second ceramic layers are selected from the group consisting of $B_4C$, $MgO$, $Al_2O_3$, $SiC$, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

5. The internal member of claim 1, wherein the film is formed by a thermal spraying method.

6. The internal member of claim 1, wherein the upper portion of the film is located on a side of the film that is opposite to a side of the film that is formed on the surface of the base material.

7. A plasma processing apparatus comprising:
    a vacuum chamber in which an object to be processed is placed;
    a gas supply member configured to supply a gas into the vacuum chamber;
    a plasma generating member configured to generate a plasma of the gas in the vacuum chamber;
    an exhausting member configured to vacuum exhaust an inside of the vacuum chamber; and
    an internal member which is installed in the vacuum chamber,
    wherein the internal member includes:
    a base material, wherein the base material comprises at least one of stainless steel, Al, Al alloy, W, W alloy, Ti, Ti alloy, Mo, Mo alloy, carbon, oxide or non-oxide based sintered ceramic body, and carbonaceous material; and
    a film formed on a surface of the base material, the film having pores therein,
    wherein the film includes a first ceramic layer and a second ceramic layer, the second ceramic layer formed in contact with the base material,
    wherein the first and second ceramic layers include at least one kind of element selected from the group consisting of B, Mg, Al, Si, Ca, Cr, Y, Zr, Ta, Ce and Nd, and at least parts of the pores in the film is sealed by a sol-gel method using Y2O3 to form a sealing-treated portion,
    wherein the sealing treated portion is formed in a lower portion of the second ceramic layer to make a contact with the base material, and
    wherein the sealing-treated portion is not formed in an upper portion of the film to suppress surface degradation of the film.

8. The plasma processing apparatus of claim 7, wherein an anodic oxidized film is formed between the base material and the film.

9. The plasma processing apparatus of claim 7, wherein the first ceramic layer is $Y_2O_3$ and the second ceramic layer is $Al_2O_3$.

10. The plasma processing apparatus of claim 7, wherein the upper portion of the film is located on a side of the film that is opposite to a side of the film that is formed on the surface of the base material.

11. An internal member of a plasma processing vessel, comprising:
    a base material;
    a coating film formed on a surface of the base material; and
    an anodic oxidized film formed between the base material and the coating film,
        wherein the anodic oxidized film is sealed by a resin,
    wherein at least a portion of the coating film is sealed by a resin or by a sol gel method to form a sealing-treated portion,
    wherein the sealing-treated portion is formed in a lower portion of the coating film to make a contact with the base material,
    wherein the sealing-treated portion is not formed in an upper portion of the coating film to suppress surface degradation of the film, and wherein the coating film is formed of ceramic including at least one kind of element selected from the group consisting of B, Mg, Al, Si, Ca, Cr, Y, Zr, Ta, Ce and Nd.

12. The internal member of claim 11, wherein the resin is selected from the group consisting of SI (silicon), PTFE (polytetrafluoroethylene), PI (polyimide), PAI (polyamide-imide), PEI (polyetherimide), PBI (polybenzimidazole) and PFA (perfluoroalkoxyalkane).

13. The internal member of claim 11, wherein the upper portion of the coating film is located on a side of the coating film that is opposite to a side of the coating film that is formed on the surface of the base material.

* * * * *